(12) United States Patent
Chang et al.

(10) Patent No.: US 11,144,386 B2
(45) Date of Patent: Oct. 12, 2021

(54) MEMORY CONTROLLER STORING DATA IN APPROXIMATE MEMORY DEVICE BASED ON PRIORITY-BASED ECC, NON-TRANSITORY COMPUTER-READABLE MEDIUM STORING PROGRAM CODE, AND ELECTRONIC DEVICE COMPRISING APPROXIMATE MEMORY DEVICE AND MEMORY CONTROLLER

(71) Applicant: University-Industry Cooperation Group of Kyung Hee University, Yongin-si (KR)

(72) Inventors: Ik Joon Chang, Yongin-si (KR); Duy Thanh Nguyen, Yongin-si (KR)

(73) Assignee: UNIVERSITY-INDUSTRY COOPERATION GROUP OF KYUNG HEE UNIVERSITY, Gyeonggi-do (KR)

( * ) Notice: Subject to any disclaimer, the term of this patent is extended or adjusted under 35 U.S.C. 154(b) by 0 days.

(21) Appl. No.: 16/661,622

(22) Filed: Oct. 23, 2019

(65) Prior Publication Data
US 2020/0341840 A1    Oct. 29, 2020

(30) Foreign Application Priority Data
Apr. 24, 2019    (KR) .................... 10-2019-0047910

(51) Int. Cl.
*G11C 29/00*    (2006.01)
*G06F 11/10*    (2006.01)
(Continued)

(52) U.S. Cl.
CPC ...... *G06F 11/1044* (2013.01); *G06F 11/0793* (2013.01); *G06F 11/1068* (2013.01);
(Continued)

(58) Field of Classification Search
None
See application file for complete search history.

(56) References Cited

U.S. PATENT DOCUMENTS 6,598,197 B1 * 7/2003 Peterson .......... G11B 20/10009
714/758
10,146,460 B1 * 12/2018 Baum ................... G06F 11/108
(Continued)

FOREIGN PATENT DOCUMENTS

KR    10-0326940 B1    3/2002
KR    10-2011-0138626 A    12/2011
(Continued)

OTHER PUBLICATIONS

WO2019/007406 (Year: 2018).*
(Continued)

*Primary Examiner* — Guerrier Merant
(74) *Attorney, Agent, or Firm* — Harness, Dickey & Pierce, P.L.C.

(57) ABSTRACT

A memory controller includes an error correction circuit that converts some bits of first data into parity bits for an error correction operation and generates second data including remaining bits of the first data and the parity bits replaced from the some bits, and a physical layer that transmits the second data instead of the first data to a memory device.

20 Claims, 16 Drawing Sheets

(51) Int. Cl.
G06F 11/14 (2006.01)
G06F 11/07 (2006.01)
G06N 3/04 (2006.01)
G11C 11/408 (2006.01)
G11C 11/56 (2006.01)
G11C 29/44 (2006.01)
G11C 29/52 (2006.01)
G06F 13/16 (2006.01)

(52) U.S. Cl.
CPC ........ *G06F 11/141* (2013.01); *G06F 13/1668* (2013.01); *G06N 3/04* (2013.01); *G11C 11/4085* (2013.01); *G11C 11/5642* (2013.01); *G11C 29/44* (2013.01); *G11C 29/52* (2013.01)

(56) References Cited

U.S. PATENT DOCUMENTS

| | | | | |
|---|---|---|---|---|
| 2010/0165692 | A1* | 7/2010 | Jeddeloh | G11C 11/4097 365/51 |
| 2011/0310685 | A1 | 12/2011 | Song | |
| 2017/0344299 | A1 | 11/2017 | Ivanov | |
| 2018/0286475 | A1* | 10/2018 | Wang | G11C 11/40622 |
| 2020/0104207 | A1* | 4/2020 | Wang | G06F 11/3058 |

FOREIGN PATENT DOCUMENTS

| | | |
|---|---|---|
| KR | 10-2016-0024472 A | 3/2016 |
| KR | 10-2019-0000896 A | 1/2019 |

OTHER PUBLICATIONS

Zhaoxia Deng, et al., "Reduced-Precision Memory Value Approximation for Deep Learning", Hewlett Packard Labs, 2015.

Tianshi Chen, et al., "DianNao: A Small-Footprint High-Throughput Accelerator for Ubiquitous Machine-Learning", ACM SIGPLAN Notices, 2014.

Jamie Liu, et al., "RAIDR: Retention-Aware Intelligent DRAM Refresh", IEEE Computer Society, vol. 40, No. 3, pp. 1-12, 2012.

Ishwar Bhati, et al., "Flexible Auto-Refresh: Enabling Scalable and Energy-Efficient DRAM Refresh Reductions", 2015 ACM/IEEE 42nd Annual International Symposium on Computer Architecture (ISCA), 2015.

Song Liu, et al., "Flikker: Saving DRAM Refresh-power through Critical Data Partitioning", ASPLOS 2011: 16th International Conference on Architectural Support for Programming Languages and Operating Systems, 2011.

Charles Eckert, et al., "Neural Cache: Bit-Serial In-Cache Acceleration of Deep Neural Networks", 2018 ACM/IEEE 45th Annual International Symposium on Computer Architecture, pp. 383-396, 2018.

Duy-Thanh Nguyen, et al., "St-DRC: Stretchable DRAM Refresh Controller with No Parity-overhead Error Correction Scheme for Energy-efficient DNNs", Conference: the 56th Annual Design Automation Conference, 2019.

Duy Thanh Nguyen, et al., "An approximate memory architecture for a reduction of refresh power consumption in deep learning applications", 2018 IEEE International Symposium on Circuits and Systems (ISCAS), 2018.

Yuanchang Chen, et al., "A Multi-Accuracy-Level Approximate Memory Architecture Based on Data Significance Analysis", 2016 IEEE Computer Society Annual Symposium on VLSI, pp. 385-390, 2016.

Shuang Chen, et al., "A Study of Sorting Algorithms on Approximate Memory", Proceedings of the 2016 International Conference on Management of Data, pp. 647-662, 2016.

Bilge E. S. Akgul, et al., "Probabilistic CMOS Technology: A Survey and Future Directions", IEEE Xplore, 2006.

\* cited by examiner

FIG. 7

```
Start
  ↓
Check temperature of memory device  — S310
  ↓
Check desired BER  — S320
  ↓
Transmit CMD for adjusting refresh
ratio based on temperature and BER  — S330
  ↓
End
```

FIG. 8

LUT

| BER | Refresh Time @Normal Temperature | Refresh Time @Extended Temperature |
|---|---|---|
| $10^{-3}$ | 6 (→ $2^6$) | 5 (→ $2^5$) |
| $10^{-4}$ | 5 (→ $2^5$) | 4 (→ $2^4$) |
| $10^{-5}$ | 4 (→ $2^4$) | 3 (→ $2^3$) |
| $10^{-6}$ | 3 (→ $2^3$) | 2 (→ $2^2$) |
| Default | 0 (→ $2^0$) | 0 (→ $2^0$) |

MEMORY CONTROLLER STORING DATA IN APPROXIMATE MEMORY DEVICE BASED ON PRIORITY-BASED ECC, NON-TRANSITORY COMPUTER-READABLE MEDIUM STORING PROGRAM CODE, AND ELECTRONIC DEVICE COMPRISING APPROXIMATE MEMORY DEVICE AND MEMORY CONTROLLER

CROSS-REFERENCE TO RELATED APPLICATIONS

This application claims priority under 35 U.S.C. § 119 to Korean Patent Application No. 10-2019-0047910 filed on Apr. 24, 2019, in the Korean Intellectual Property Office, the disclosures of which are incorporated by reference herein in their entireties.

BACKGROUND

Embodiments of the inventive concept described herein relate to a memory controller storing data in an approximate memory device based on a priority-based ECC, a non-transitory computer-readable medium storing a program code, and an electronic device including the approximate memory device and the memory controller.

An artificial intelligence technology that is based on an artificial neural network (ANN) similar to a biological neural network is being used in various fields such as image recognition, voice recognition, translation, search, deep learning, data collection and analysis, and autonomous driving. As hardware of a computing device develops, a deep neural network (DNN) including a plurality of hidden layers is being mainly used.

In learning, training, or inference of the neural network, a plurality of parameters may be generated, referenced, or updated. As these parameters increase, a capacity or the degree of integration of a memory device storing parameters or the number of memory devices storing parameters is also increasing. Accordingly, it is necessary to reduce power consumption of a memory device that is required to execute a neural network.

SUMMARY

Embodiments of the inventive concept provide a memory controller storing data in an approximate memory device based on a priority-based ECC, a non-transitory computer-readable medium storing a program code, and an electronic device including the approximate memory device and the memory controller.

According to an exemplary embodiment, a memory controller includes an error correction circuit that converts some bits of first data into parity bits for an error correction operation and generates second data including remaining bits of the first data and the parity bits replaced from the some bits, and a physical layer that transmits the second data instead of the first data to a memory device.

According to an exemplary embodiment, a non-transitory computer-readable medium storing a program code that, when executed by a processor, causes the processor to convert some bits of first data into parity bits for an error correction operation, to generate second data including remaining bits of the first data and the parity bits replaced from the some bits, and to generate a write command for storing the second data in a memory device.

According to an exemplary embodiment, an electronic device includes a processor that generate first data, a memory controller that converts some bits of the first data into parity bits for an error correction operation and generates second data including remaining bits of the first data and the parity bits replaced from the some bits, and a memory device that stores the second data transmitted from the memory controller.

BRIEF DESCRIPTION OF THE FIGURES

The above and other objects and features of the inventive concept will become apparent by describing in detail exemplary embodiments thereof with reference to the accompanying drawings.

FIG. 7 illustrates an exemplary flowchart in which a memory controller of FIG. 3 adjusts a refresh ratio based on a temperature and a BER.

FIG. 8 illustrates an example of a lookup table indicating a relationship between a BER and a refresh.

DETAILED DESCRIPTION

Figure 1:
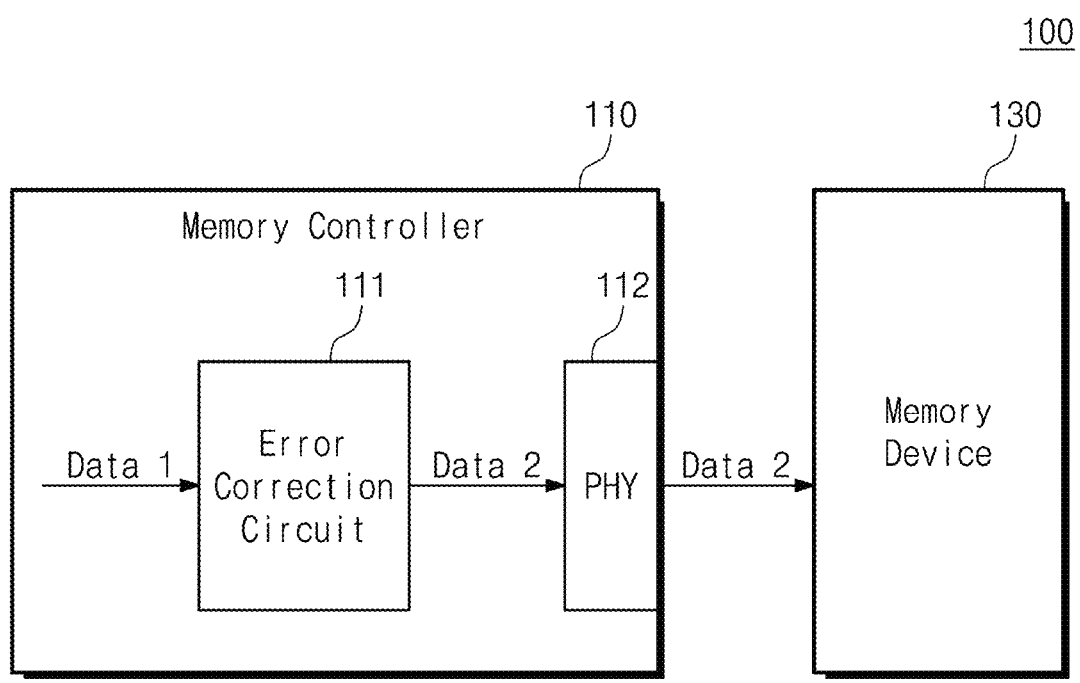
FIG. 1 illustrates is a block diagram of an electronic device according to an embodiment of the inventive concept.

FIG. 1 illustrates is a block diagram of an electronic device according to an embodiment of the inventive concept. An electronic device 100 may be referred to as an "electronic system", a "computing system", or a "memory system". For example, the electronic device 100 may be, but is not limited to, a desktop computer, a laptop computer, a workstation, a server, a mobile device, etc. The electronic device 100 may include a memory controller 110 and a memory device 130.

The memory controller 110 may control the memory device 130. The memory controller 110 may generate commands and addresses for accessing the memory device 130. The memory controller 110 may generate data to be stored to the memory device 130. The memory controller 110 may receive data stored in the memory device 130.

The memory controller 110 may include an error correction circuit 111 and a physical layer 112 (hereinafter referred to as a "PHY"). The error correction circuit 111 may receive first data. The first data may be provided from the outside (e.g., a processor or a buffer memory) of the memory controller 110 or may be generated in the memory controller 110. The first data may refer to data to be stored in the memory device 130. For example, the first data may be generated as an application program is executed or may be used to execute the application program.

The error correction circuit 111 may perform an encoding operation on write data (or the first data) to be stored in the memory device 130. The error correction circuit 111 may perform a decoding operation on read data transmitted from the memory device 130. For example, the error correction circuit 111 may generate parity bits for the write data. The error correction circuit 111 may correct an error in the read data by using parity bits of the read data transmitted from the memory device 130. The error of the read data may occur due to various factors of the memory device 130, such as a process, voltage, and temperature (PVT) variation, a retention characteristic, interference, degradation, a noise, a refresh rate, and the degree of integration.

In detail, the error correction circuit 111 may generate parity bits of the first data based on an error correction code. The parity bits may be used to protect message bits of the first data against damage. Unlike a general encoding way using the error correction code ECC, the error correction circuit 111 according to an embodiment of the inventive concept may not add parity bits to the message bits of the first data. Instead, the error correction circuit 111 may replace some bits of the message bits of the first data with parity bits. The error correction circuit 111 may convert some bits of the message bits of the first data into parity bits for an error correction operation. The error correction circuit 111 may generate second data including the parity bits and the remaining bits of the message bits of the first data.

As described above, because the error correction circuit 111 converts some bits into parity bits without adding parity bits to the message bits of the first data, the size (or the number of bits) of the first data may be equal to that of the second data. The error correction circuit 111 may convert the first data into the second data and may provide the second data to the PHY 112. The memory device 130 may store the second data, which are generated by encoding the first data, under control of the memory controller 110. Some bits, which are replaced with parity bits, from among message bits may not be stored in the memory device 130.

The PHY 112 may be also referred to as an "interface circuit". The PHY 112 may directly communicate with the memory device 130. The PHY 112 may operate in compliance with an interface standard, which the memory device 130 supports, such as a toggle double data rate (DDR) standard, a DDR synchronous dynamic random access memory (SDRAM) standard, or a joint electron device engineering council (JEDEC) standard. The PHY 112 may drive physical paths forming a channel between the memory controller 110 and the memory device 130. The PHY 112 may transmit, to the memory device 130, a command, an address, and write data (i.e., the second data) generated by the memory controller 110. The PHY 112 may receive read data from the memory device 130 and may provide the received read data to the error correction circuit 111. Referring to FIG. 1, the PHY 112 may transmit the second data converted and generated by the error correction circuit 111, to the memory device 130. The PHY 112 may transmit the second data, not the first data, to the memory device 130.

The memory device 130 may store write data transmitted from the memory controller 110 under control of the memory controller 110. Under control of the memory controller 110, the memory device 130 may transmit stored data as read data to the memory controller 110. For example, the memory device 130 may be, but is not limited to, a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a spin transfer torque magnetic random access memory (STT-MRAM) device, a solid state drive (SSD), a memory card, universal flash storage (UFS), etc.

Referring to FIG. 1, the memory device 130 may receive and store the second data from the memory controller 110. In the case where the memory device 130 is a DRAM device, because a time when data (i.e., charges) stored in a memory cell of the memory device 130 are retained is limited, it is necessary to refresh data stored in a memory cell before the data stored in the memory cell are lost. For example, the memory device 130 may periodically or randomly refresh the second data in response to a repetitive auto-refresh request of the memory controller 110. For another example, the memory device 130 may refresh the second data periodically or randomly in response to a self-refresh request of the memory controller 110 by itself. The memory device 130 may perform a refresh operation on data stored in all DRAM cells, as well as the second data illustrated in FIG. 1.

As the capacity and integration of the memory device 130 and the number of memory devices 130 increase, a power (e.g., IDD5, IDD6, etc.) that is necessary for the memory device 130 to perform a refresh operation increases. In the case where the electronic device 100 executes an artificial neural network (or an application program) such as a deep neural network, power consumption of the memory device 130 may considerably increase due to a refresh operation. For example, the artificial neural network that is executed by the electronic device 100 may include a deep neural network (DNN), a convolution neural network (CNN), a recurrent neural network (RNN), a spiking neural network (SNN), etc.

To reduce the power consumption of the memory device 130, the memory controller 110 may decrease a refresh rate of the memory device 130 and may operate the memory device 130 as an approximate memory device. The memory controller 110 may reduce the power consumption of the memory device 130 due to the refresh operation by decreasing the refresh rate of the memory device 130.

A slow refresh rate may cause the loss of data stored in a memory cell. The slow refresh rate may cause an increase in a bit error rate of the memory device 130 and may have an influence on the accuracy of calculation of an application program that is executed by using the electronic device 100. Nevertheless, the memory controller 110 may permit the probability that an error occurs in the memory device 130, due to the slow refresh rate. For example, the memory controller 110 may use a priority-based ECC such that the BER of the memory device 130 operating at the slow refresh rate does not have an influence on the accuracy of calculation of the application program.

Before storing the first data in the memory device 130, the memory controller 110 may encode the first data using the priority-based ECC and may store the second data obtained by encoding the first data in the memory device 130. The error correction circuit 111 of the memory controller 110 may replace some bits of the first data with parity bits. A priority that the error correction circuit 111 selects some bits to be replaced with parity bits, that is, a reference may be a significance of each of bits. The error correction circuit 111 may replace some insignificant bits with parity bits. The error correction circuit 111 may protect the remaining significant bits from an error by using parity bits.

Whether the memory controller 110 is able to effectively use the memory device 130 as an approximate memory may depend on how to divide bits of data into significant bits and insignificant bits, that is, whether to replace any bit of the bits of the data with a parity bit. How some of message bits are replaced with parity bits by the error correction circuit 111 will be more fully described with reference to FIGS. 2A to 2C.

Figure 2A:
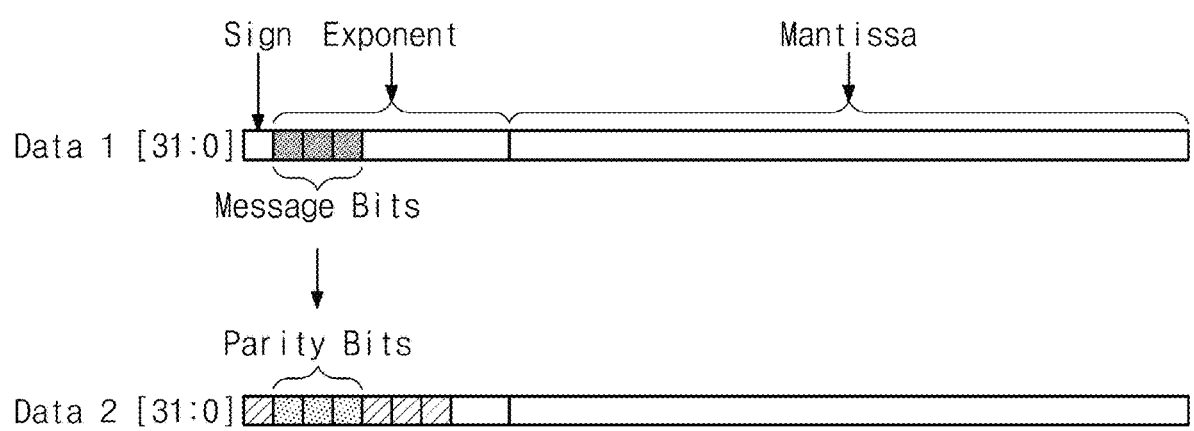
FIG. 2A illustrates an example where first data of FIG. 1 are converted into second data.
Figure 2B:
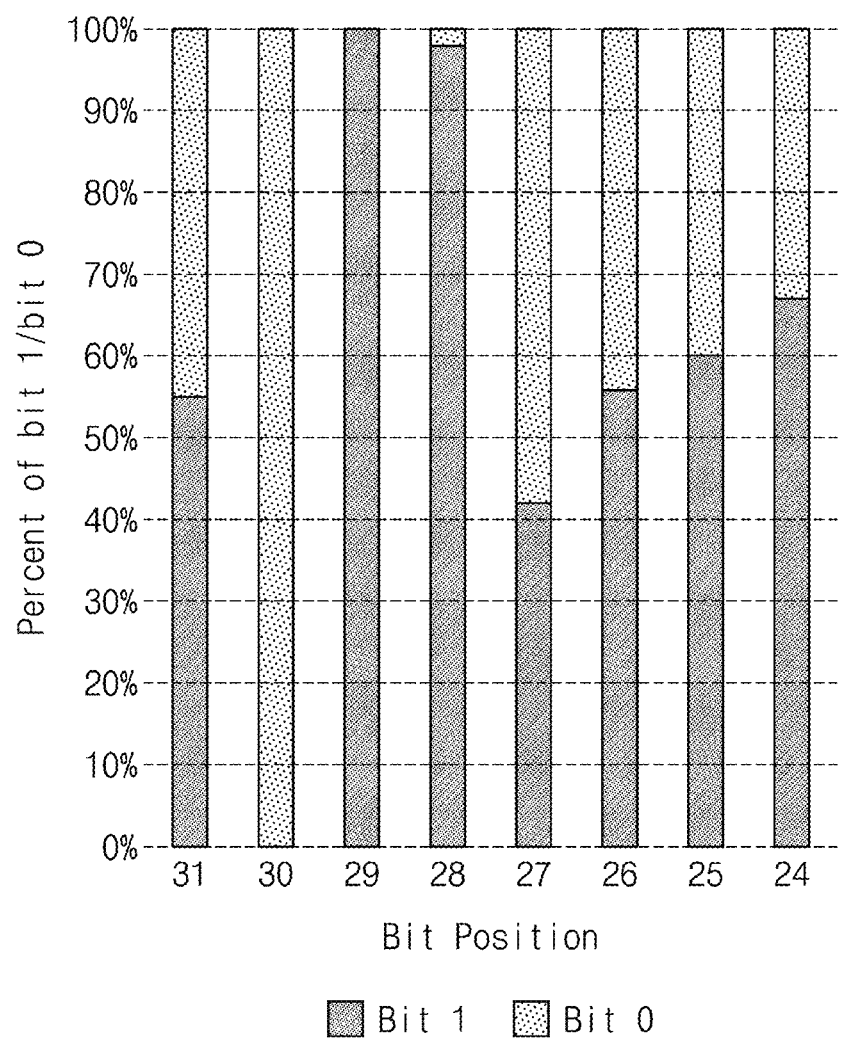
FIG. 2B illustrates exemplary values of some bits of first data of FIG. 1.

FIG. 2A illustrates an example where first data of FIG. 1 are converted into second data. FIG. 2B illustrates exemplary values of some bits of first data of FIG. 1. FIGS. 2A and 2B will be described together with reference to FIG. 1.

The first data (Data 1) may be expressed, for example, in a floating-point format specified in the IEEE 754. Message bits of the first data expressed by the floating-point format may include a sign bit, exponent bits, and mantissa (or fraction) bits. For example, the floating-point format may include, but is not limited to, a half-precision floating-point format, a single-precision floating-point format, a double-precision floating-point format, an extended-precision floating-point format, a quadruple-precision floating-point format, etc.

Referring to FIG. 2A, the first data may be expressed by the single-precision floating-point format, and the number of bits of the first data may be "32". However, the inventive concept is not limited thereto. Message bits of the first data may include one sign bit "s", 8 exponent bits "e", and 23 mantissa bits "m". A value of the floating-point format {s, e, m} may be $-1^s \times M \times 2^E$. Here, $M=1 \cdot m$, and $E=e-127$. A sign bit of the first data may be a most significant bit (MSB), and the rightmost bit of mantissa bits may be a least significant bit (LSB). In the first data, bits positioned relatively on the left may be more significant than bits positioned relatively on the right. An order of priority from the MSB to the LSB may be a sign bit, exponent bits, upper bits of the mantissa, and lower bits of the mantissa.

Values of upper bits [31:24] among bits of the first data are illustrated in FIG. 2B as an example. A horizontal axis denotes a bit position, and a vertical axis denotes percentages of bit 1 and bit 0. For example, the first data of FIGS. 2A and 2B may be data to be stored in the memory device 130 as a neural network such as a DNN, a CNN, an RNN, or an SNN is executed by using the electronic device 100 or may be weight parameters of the neural network. The first data may be used for an operation of a neural network. For example, a range of weight parameters may be $[2^{-13}:2^{-2}]$. According to the above range, values of some bits [30, 29, 28] of the first data may be fixed to [0, 1, 1].

The bits [30, 29, 28] of the first data may be message bits constituting the first data. However, because values of the bits [30, 29, 28] of the first data are fixed to [0, 1, 1], the error correction circuit 111 may replace (or convert) the bits [30, 29, 28] with (or into) parity bits based on an error correction code. The error correction circuit 111 may generate the second data (Data 2) including the remaining bits [31] and [27:0] of the first data and the parity bits. Positions of the parity bits of the second data may respectively correspond to positions of the bits [30, 29, 28] of the first data. Values of the message bits [31] and [27:0] of the second data may be equal to values of message bits [31] and [27:0] of the first data. Positions of the message bits [31] and [27:0] of the second data may respectively correspond to the positions of the message bits [31] and [27:0] of the first data. However, the positions of the message and parity bits of the second data are not limited to the example illustrated in FIG. 2A.

After the second data are stored in the memory device 130, the error correction circuit 111 may receive and decode the second data read from the memory device 130. The second data read from the memory device 130 may be equal to the second data that the PHY 112 transmits to the memory device 130 or may be different from the second data, which the PHY 112 transmits to the memory device 130, due to an error. The error correction circuit 111 may perform an error correction operation on bits [31, 27, 26, 25] of the second data by using parity bits. As the error correction circuit 111 replaces the bits having the fixed values with parity bits, the parity bits may be stored in the memory device 130 instead of the fixed values, and the error correction circuit 111 may perform the error correction operation by using the parity bits. The error correction circuit 111 may use values of the bits [30, 29, 28] of the second data for the error correction operation and then may set, change, or correct the values to [0, 1, 1].

The error correction circuit 111 may protect the remaining bits [31, 27, 26, 25] of the first data from an error by replacing the bits [30, 29, 28] of the first data with parity bits. The error correction circuit 111 may select remaining bits to be protected by using parity bits, depending on a priority, that is, a significance. For example, the error correction circuit 111 may select remaining bits [31, 27, 26, 25] among all the remaining bits [31] and [27:0] depending on an order from the MSB to the LSB and may protect the remaining bits [31, 27, 26, 25] by using the parity bits. Positions of remaining bits to be protected by using parity bits are not limited to the example illustrated in FIG. 2A.

In an embodiment, a position of a bit having a fixed value from among bits of the first data is not limited to the description given with reference to FIGS. 2A and 2B. A position of a bit having a fixed value may be variously changed depending on a kind of an application program executable by using the electronic device 100, a kind of data generated by the application program, a range of a data value, etc.

In an embodiment, the number of bits each having a fixed value from among bits of the first data is not limited to the description given with reference to FIGS. 2A and 2B. As the number of bits each having a fixed value increases, the number of remaining message bits to be protected by the error correction circuit 111 may increase. The number of correctable error bits may be changed depending on a kind of an error correction code that the error correction circuit 111 uses. In FIGS. 2A and 2B, an error correction code may be a hamming code. The error correction circuit 111 may protect four message bits [31, 27, 26, 25] by using three parity bits [30, 29, 28]. For example, a condition of $2^k-1 \geq n+k$ may be satisfied, "n" is the number of message bits, and "k" is the number of parity bits. The error correction circuit 111 may use any other error correction code, such as a BCH (Bose-Chauduhuri-Hocquenghen) code, an RS (Reed-Solomon) code, a Viterbi code, a turbo code, or an LDPC (low density parity check), as well as the hamming code.

Figure 2C:
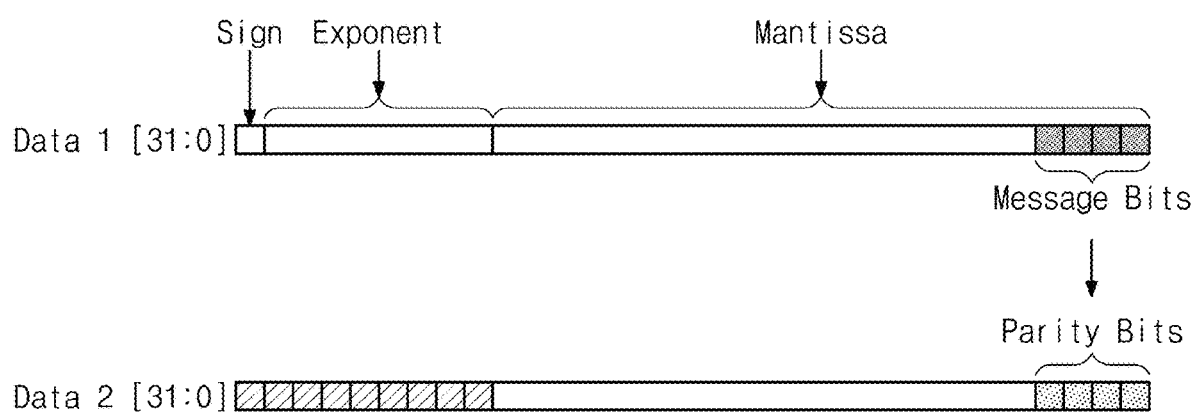
FIG. 2C illustrates another example where first data of FIG. 1 are converted into second data.

FIG. 2C illustrates another example where first data of FIG. 1 are converted into second data. FIG. 2C will be described with reference to FIG. 1. FIG. 2C will be described under the same condition as FIG. 2A, that is, under the condition that the first data are expressed by the floating-point format and the number of bits of the first data is "32". As described above, in the first data, bits positioned relatively on the left may be more significant than bits positioned relatively on the right.

For example, the error correction circuit 111 may replace lower bits [3:0] of the first data as insignificant bits with parity bits. The lower bits [3:0] of the first data may be message bits constituting the first data. The error correction circuit 111 may generate the second data (Data 2) including the remaining bits [31:4] of the first data and the parity bits. Positions of the parity bits of the second data may respectively correspond to positions of the bits [3:0] of the first data. Values of the message bits [31:4] of the second data may be equal to values of message bits [31:4] of the first data. Positions of the message bits [31:4] of the second data may respectively correspond to the positions of the message bits [31:4] of the first data. However, the positions of the message and parity bits of the second data are not limited to the example illustrated in FIG. 2C.

After the second data are stored in the memory device 130, the error correction circuit 111 may receive and decode the second data read from the memory device 130. The error correction circuit 111 may perform an error correction operation on bits [31:23] of the second data by using parity bits. That is, as the error correction circuit 111 replaces the lower bits [3:0] with parity bits and may then store the parity bits in the memory device 130 instead of original values of the lower bits [3:0], and the error correction circuit 111 may perform the error correction operation by using the parity bits.

The error correction circuit 111 may protect the remaining bits [31:23] of the first data from an error by replacing the lower bits [3:0] of the first data with parity bits. As described above, the error correction circuit 111 may select remaining bits to be protected by using parity bits, depending on a priority, that is, a significance. For example, the error correction circuit 111 may select remaining bits [31:23] among all the remaining bits [31:4] depending on an order from the MSB to the LSB and may protect the remaining bits [31:23] by using the parity bits. Here, the number and positions of lower bits that the error correction circuit 111 replaces with parity bits, and the number and positions of message bits to be protected by using parity bits are not limited to the example illustrated in FIG. 2C.

Figure 3:
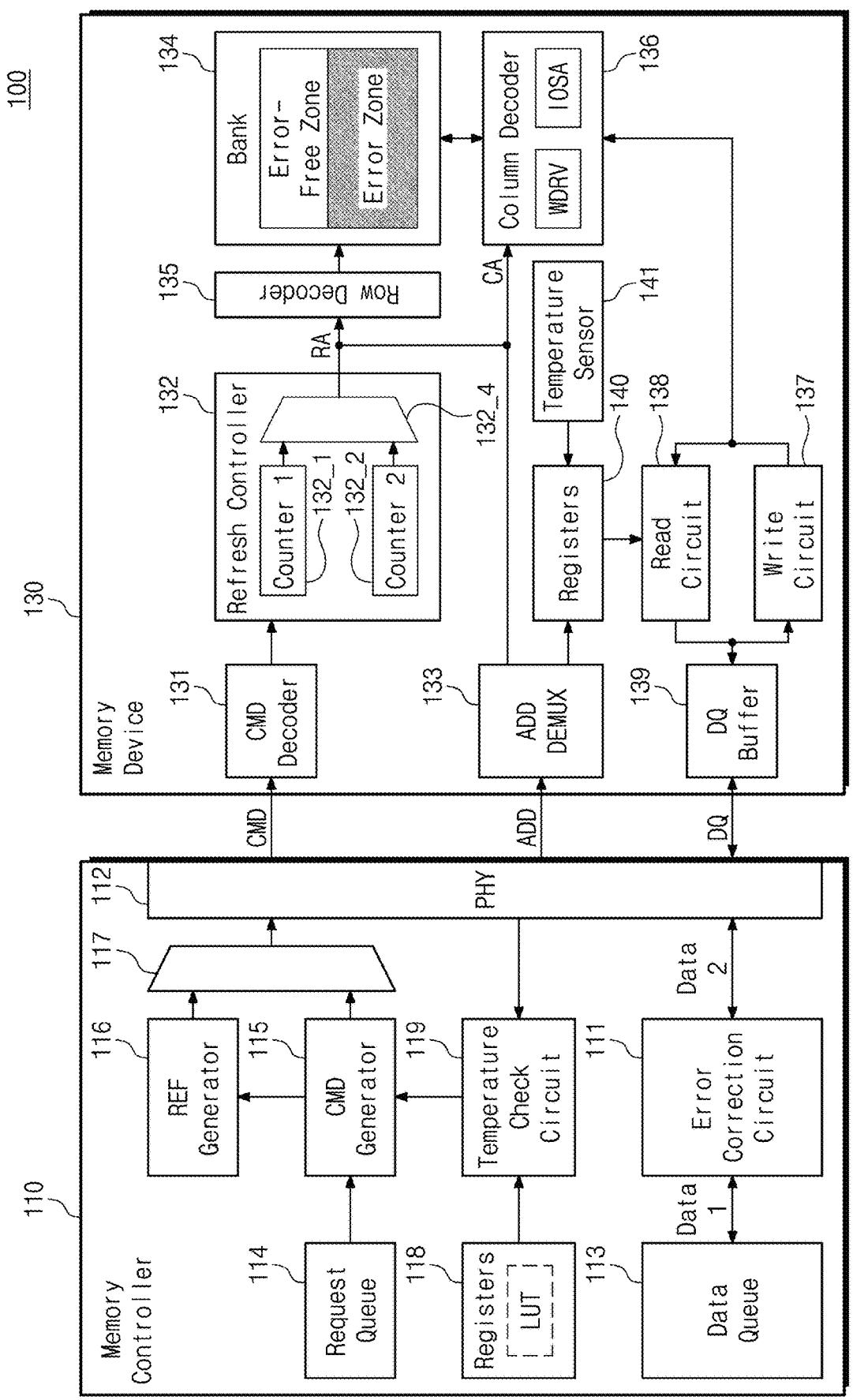
FIG. 3 illustrates an exemplary block diagram of an electronic device of FIG. 1 in detail.

FIG. 3 illustrates an exemplary block diagram of an electronic device of FIG. 1 in detail. As described above, the electronic device 100 may include the memory controller 110 and the memory device 130.

The memory controller 110 may include the error correction circuit 111, the PHY 112, a data queue 113, a request queue 114, a command generator 115, a refresh command generator 116, a multiplexer 117, registers 118, and a temperature check circuit 119. The error correction circuit 111 and the PHY 112 are described with reference to FIG. 1 and FIGS. 2A to 2C.

The data queue 113 may store write data to be stored in the memory device 130. The data queue 113 may provide the stored write data to the error correction circuit 111. After read data are transmitted from the memory device 130 and the error correction circuit 111 performs decoding on the read data, the data queue 113 may receive and store the decoded data from the error correction circuit 111.

Figure 14:
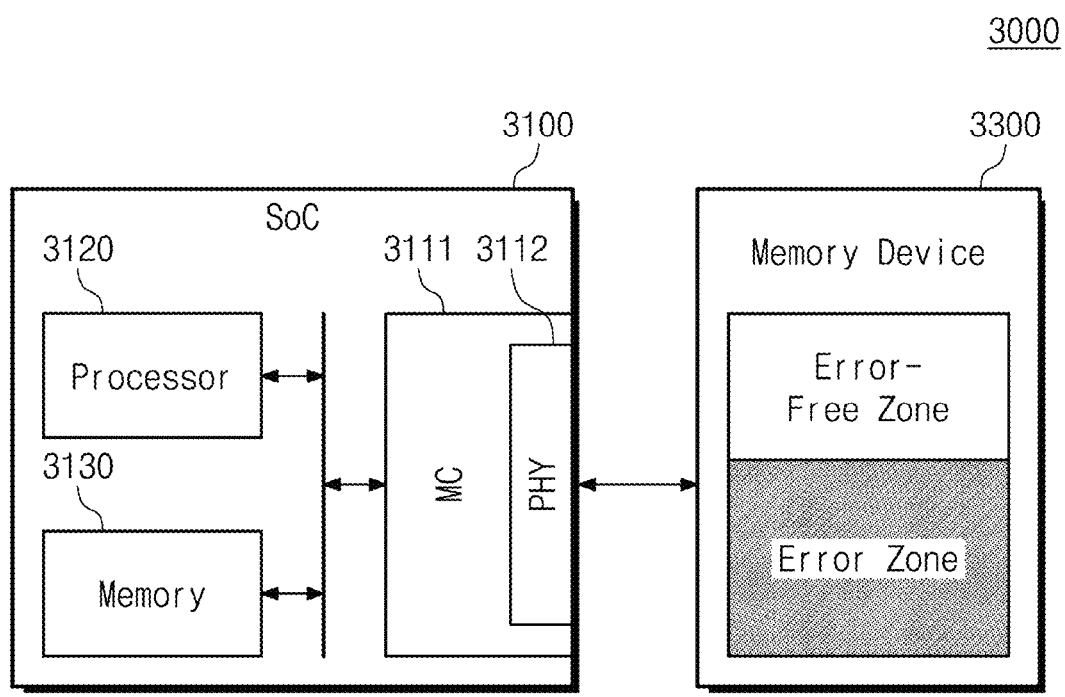
FIG. 14 illustrates is an exemplary block diagram of an electronic device according to another embodiment of the inventive concept.

The request queue 114 may store commands and addresses generated by a processor (not illustrated) (refer to 3120 of FIG. 14). The request queue 114 may provide the stored command and address to the command generator 115. In an embodiment, regions for the data queue 113 and the request queue 114 may be in advance allocated to an on-chip memory, that is, a buffer memory, positioned in a circuit where the memory controller 110 is implemented. For example, the data queue 113 and the request queue 114 may be implemented in the memory controller 110 by using registers, flip-flops, latches, an SRAM device, etc. For another example, the data queue 113 and the request queue 114 may be implemented on a memory device that is provided outside the memory controller 110.

The command generator 115 may generate a command or an address to be provided to the memory device 130. For example, a command may include an active command, a read command, a write command, a precharge command, an erase command, etc. The address may indicate a position of the memory device 130, at which data will be stored, or may indicate a position of data stored in the memory device 130. The refresh command generator 116 may periodically or randomly generate a refresh command to be provided to the memory device 130 for retaining data stored in the memory device 130, independently of requests input to the request queue 114. The refresh command generator 116 may include a counter for calculating a time to issue a refresh command. The multiplexer 117 may provide one of a command generated by the command generator 115 and a command generated by the refresh command generator 116 to the PHY 112. Unlike the example illustrated in FIG. 3, the refresh command generator 116 and the multiplexer 117 may be integrally formed in the command generator 115. In this case, the command generator 115 may generate the refresh command.

The registers 118 may store a lookup table LUT. For example, the lookup table LUT may store mapping information between a BER and a refresh rate. The registers 118 may be included in an on-chip memory that is positioned in the circuit where the memory controller 110 is implemented. The temperature check circuit 119 may check a current temperature of the memory device 130 through the PHY 112. The temperature check circuit 119 may provide the command generator 115 with information for adjusting a refresh rate of the memory device 130 based on the lookup table LUT stored in the registers 118 and the current temperature of the memory device 130. The refresh command generator 116 may adjust or control the refresh rate of the memory device 130 under control of the command generator 115. For example, the refresh command generator 116 may adjust a period to generate the refresh command.

As described above, the PHY 112 may receive the second data and may transmit the second data to the memory device 130. The PHY 112 may drive DQ (data input/output) signals such that bits of the second data are transmitted through the DQ signals. The PHY 112 may receive read data transmitted from the memory device 130, that is, logical values of the DQ signals according to the read data. The PHY 112 may transmit a command CMD and an address ADD to the memory device 130 depending on a command and an address generated by the command generator 115. The PHY 112 may transmit the command CMD to the memory device 130 depending on the refresh command generated by the refresh command generator 116. The PHY 112 may drive command signals or address signals. Logical values of command and address signals (e.g., ACT_n, RAS_n, CAS_n, WE_n, A0-A17, BA0, BA1, BG0, BG1, etc.) may be specified by the JEDEC standard.

For example, all components of the memory controller 110 may be implemented in an integrated circuit in the form of hardware. For another example, the error correction circuit 111 of the memory controller 110 may be implemented in the memory controller 110 in the form of software, hardware, or a combination thereof.

The memory device 130 may include a command decoder 131, a refresh controller 132, an address demultiplexer 133, a bank 134, a row decoder 135, a column decoder 136, a write circuit 137, a read circuit 138, a DQ buffer 139, registers 140, and a temperature sensor 141. The above-described components may be implemented in the memory device 130 in the form of hardware.

The command decoder 131 may decode a command output from the PHY 112 and may control internal components of the memory device 130. The command decoder 131 may receive and decode the refresh command and may then control the refresh controller 132. The refresh controller 132 may include a first counter 132_1, a second counter 132_2, and a multiplexer 132_4. The refresh controller 132 may include the first counter 132_1 and the second counter 132_2 under control of the command decoder 131. The first counter 132_1 may generate a row address corresponding to an error-free zone of the bank 134. The second counter 132_2 may generate a row address corresponding to an error zone of the bank 134.

In an embodiment, the first counter 132_1 may generate and update a row address corresponding to the error-free zone whenever the refresh command is input to the memory device 130. The refresh controller 132 may trigger the first counter 132_1 whenever the refresh command is received. In contrast, the second counter 132_2 may generate and update a row address corresponding to the error zone in response to only a part of the refresh commands input to the memory device 130. The refresh controller 132 may trigger the second counter 132_2 in response to only a part of the input refresh commands and may not trigger the second counter 132_2 with regard to the remaining refresh commands. A time interval between times when a row address corresponding to the error-free zone is updated by the first counter 132_1 may be smaller than a time interval between times when a row address corresponding to the error zone is updated by the second counter 132_2. The multiplexer 132_4 may provide the row decoder 135 with one of a row address of the first counter 132_1 and a row address of the second counter 132_2. Unlike the example illustrated in FIG. 3, the multiplexer 132_4 may provide the row decoder 135 with a row address of the first counter 132_1 and a row address of the second counter 132_2 together.

The address demultiplexer 133 may provide the address ADD received together with a command to internal components of the memory device 130 under control of the command decoder 131. The address demultiplexer 133 may provide the row decoder 135 with an address transmitted together with an active command from the PHY 112 as a row address. The address demultiplexer 133 may provide the column decoder 136 with an address transmitted together with a read command or a write command from the PHY 112 as a column address. The address demultiplexer 133 may provide the registers 140 with an address received together with a setting command from the PHY 112 as a setting code. The setting code may be referred to as an "operation code OPCODE" or an "operand".

The bank 134 may include a memory cell array. The bank 134 may refer to a unit for distinguishing memory cells of the memory device 130. The memory cell array may include memory cells connected to word lines (not illustrated) and bit lines (not illustrated). For convenience of illustration, one bank 134 is illustrated in FIG. 3, but the memory device 130 may include one or more banks.

The memory cells of the bank 134 may be divided into the error-free zone and the error zone. For example, memory cells allocated to the error-free zone and memory cells allocated to the error zone may be manufactured substantially identically. Under control of the refresh controller 132, the memory cells included in the error-free zone may be refreshed more frequently than the memory cells included in the error zone. Power consumption of the memory device 130 due to the refresh operation in the case where the bank 134 includes the error zone (i.e., when the memory device 130 operates as an approximate memory) may be smaller than power consumption of the memory device 130 due to the refresh operation in the case where all the memory cells of the bank 134 are allocated to the error-free zone (i.e., in the case where the error zone is absent from the bank 134 and the memory device 130 operates as a normal memory, not an approximate memory). As the error zone becomes larger than the error-free zone, a difference of the power consumptions may increase. The BER of data stored in the memory cells included in the error zone may be higher than the BER of data stored in the memory cells included in the error-free zone, due to a slow refresh rate.

The row decoder 135 may decode a row address RA under control of the command decoder 131. The row decoder 135 may select or activate at least one word line corresponding to a row address. The row decoder 135 may receive a row address output from the PHY 112, a row address generated by the first counter 132_1, or a row address generated by the second counter 132_2 as the row address RA. For example, the row decoder 135 may receive a row address corresponding to the active command from the address demultiplexer 133. The row decoder 135 may receive a row address corresponding to the refresh command from one of the first and second counters 132_1 and 132_2.

Under control of the command decoder 131 and the refresh controller 132, the row decoder 135 may refresh the memory cells in the error zone more frequently than the memory cells in the error-free zone. A row address indicating at least one or more word lines among word lines of the error-free zone may be provided to the row decoder 135 more frequently than a row address indicating at least one or more word lines among word lines of the error zone.

In an embodiment, the memory controller 110 may directly generate a row address for designating a word line to be activated according to the active command and may provide the row address to the memory device 130. Unlike the case of generating the active command, the memory controller 110 may provide only the refresh command to the memory device 130 and may not directly designate a word line to be refreshed. The memory device 130 may include the refresh controller 132 that internally generates a row address indicating a word line to be refreshed in response to the refresh command. The memory device 130 may operate as an approximate memory. The refresh controller 132 may include the first counter 132_1 that generates row addresses indicating word lines included in the error-free zone and the second counter 132_2 that generates row addresses indicating word lines included in the error zone.

The column decoder 136 may decode a column address CA under control of the command decoder 131. The column decoder 136 may select or activate at least one column select line corresponding to the column address. Two or more bit lines may be connected to a column select line. For example, memory cells corresponding to the row address and the column address may be selected, and a data input/output may be performed on the selected memory cells. The column decoder 136 may include a write driver WDRV and an input/output sense amplifier IOSA.

The write driver WDRV may receive write data from the write circuit 137 and may write the write data in the selected memory cells under control of the command decoder 131. The input/output sense amplifier IOSA may sense read data from the selected memory cells and may provide the read data to the read circuit 138.

The write circuit 137 may receive and deserialize bits of the write data included in the DQ signals transmitted from the PHY 112 through the DQ buffer 139. The write circuit 137 may provide write data to the write driver WDRV. The read circuit 138 may receive and serialize the read data from the input/output sense amplifier IOSA. The read circuit 138 may provide the read data to the DQ buffer 139. The DQ buffer 139 may receive the DQ signals from the PHY 112 or may output the DQ signals to the PHY 112. Since the DQ signals are bidirectional signals, the DQ buffer 139 may include both a receiver (not illustrated) and a transmitter (not illustrated).

The registers 140 may store the setting code provided from the address demultiplexer 133, that is, setting information under control of the command decoder 131. For example, the registers 140 may be referred to as "mode registers" or "multi-purpose registers". The memory controller 110 may change values stored in the registers 140 and may set or adjust an operation condition, an operation mode, etc. of the memory device 130.

The temperature sensor 141 may sense a current temperature in the memory device 130. The temperature sensor 141 may store a value indicating a current temperature in the registers 140. The memory controller 110 may issue a command for reading the registers 140. A value of a current temperature sensed by the temperature sensor 141 may be stored in the registers 140, and the value stored in the registers 140 may be transmitted to the memory controller 110 in response to the above-described command. For example, the command decoder 131 may decode a command for reading the registers 140 and may provide values stored in the registers 140 to the read circuit 138. The read circuit 138 may provide the values stored in the registers 140 to the DQ buffer 139 as read data. The DQ buffer 139 may transmit DQ signals including the values stored in the registers 140 to the PHY 112.

Figure 4:
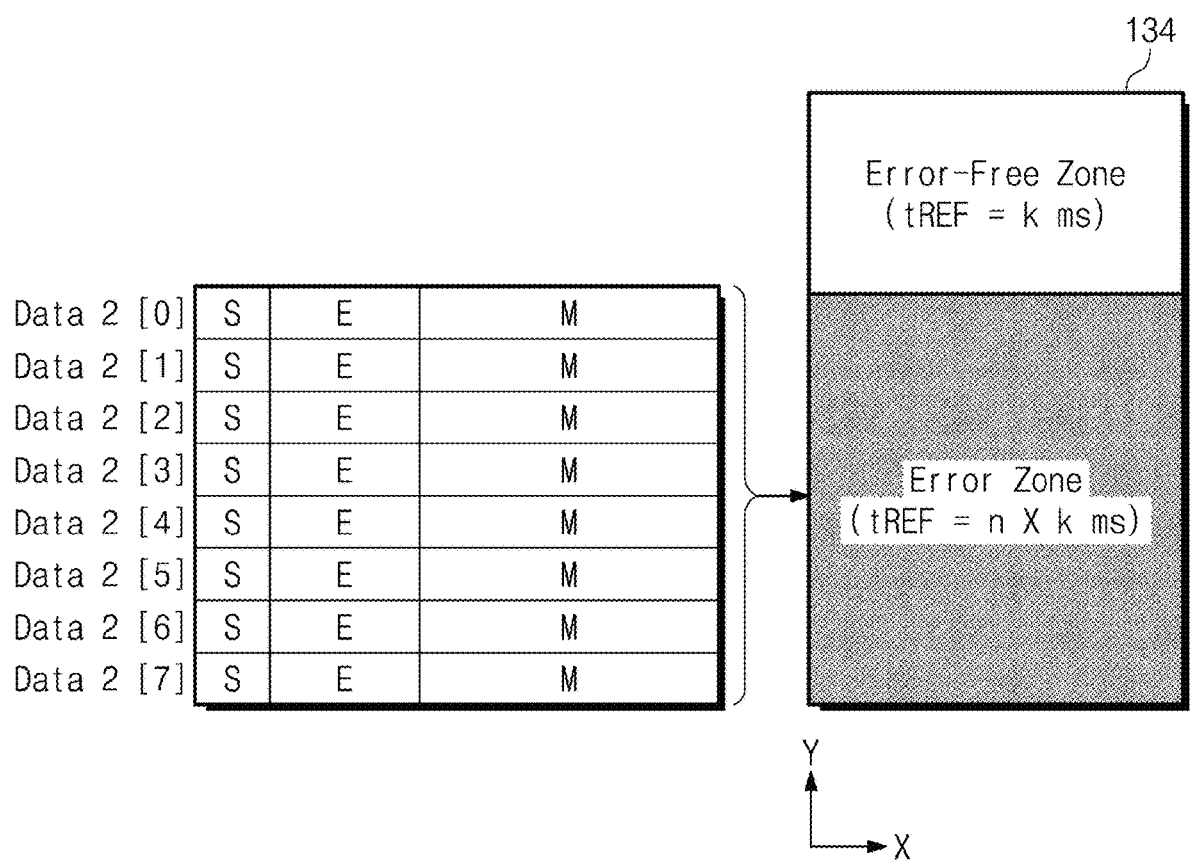
FIG. 4 illustrates an example where second data of FIG. 3 are stored in a bank of a memory device.

FIG. 4 illustrates an example where second data of FIG. 3 are stored in a bank of a memory device. The memory controller 110 may store a second data set Data 2[0] to Data 2[7] in memory cells corresponding to the error zone of the bank 134. A data set may mean a plurality of data, and an index may be for distinguishing data. In FIG. 4, an x-axis denotes a direction in which a word line extends, and a direction in which a plurality of bit lines are arranged. In FIG. 4, a y-axis denotes a direction in which a bit line extends, and a direction in which a plurality of word lines are arranged. For example, respective data of the second data set Data 2[0] to Data 2[7] may be stored in the error zone of the bank 134 in the unit of row. One data may be stored in memory cells that are connected to a word line and constitutes a page.

In an embodiment, a time tREF taken to refresh all the memory cells of the error-free zone may be "k" ms (k being any number). A time tREF taken to refresh all the memory cells of the error zone may be "n×k" ms. Here, "n" may be a natural number of 2 or more. The time tREF of the error zone may correspond to a multiple of the time tREF of the error-free zone. A refresh rate of the error-free zone may be higher than a refresh rate of the error zone.

In an embodiment, the memory controller 110 may determine whether to store data in the error-free zone or the error zone, based on a kind of the data, a significance of the data, and a kind of an application program. The memory controller 110 may store data of a neural network in the error zone. The memory controller 110 may store a program code or data of an application program different from the neural network in the error-free zone.

Figure 5:
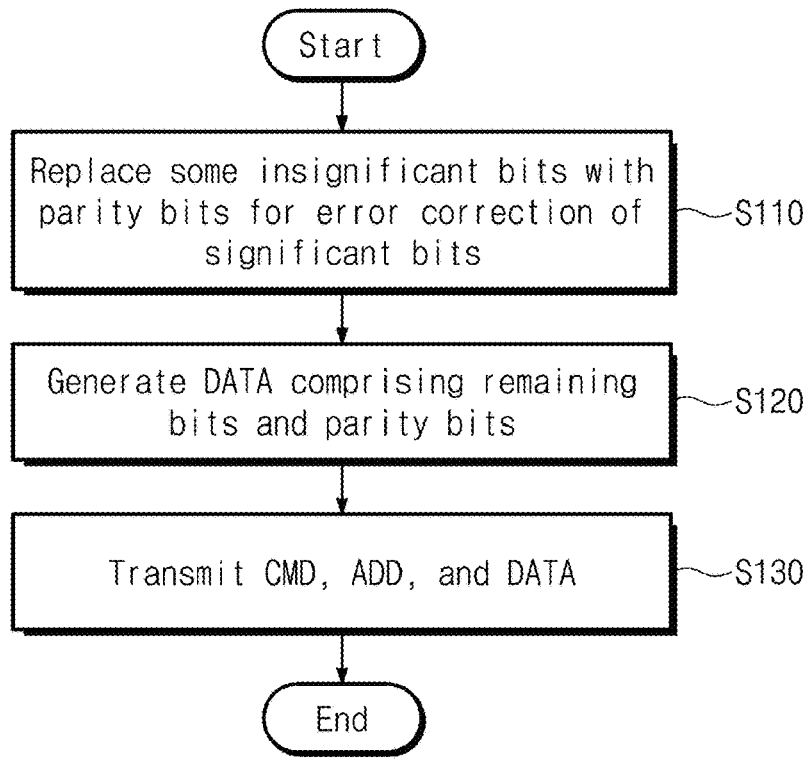
FIG. 5 illustrates an exemplary flowchart in which a memory controller of FIG. 3 stores second data in a memory device.

FIG. 5 illustrates an exemplary flowchart in which a memory controller of FIG. 3 stores second data in a memory device.

In operation S110, the error correction circuit 111 of the memory controller 110 may replace some insignificant bits of the first data with parity bits for correcting an error of significant bits of the first data. The error correction circuit 111 may select some insignificant bits to be replaced with parity bits based on a significance of a bit (refer to Data 1[31:0] of FIGS. 2A and 2C).

In operation S120, the error correction circuit 111 may generate the second data including the remaining bits of the first data and the parity bits (refer to Data 2[31:0] of FIGS. 2A and 2C). Because the error correction circuit 111 replaces some insignificant bits with parity bits without adding the parity bits to the first data, the number of bits of the second data may be equal to the number of bits of the first data.

In operation S130, the command generator 115 of the memory controller 110 may generate a command and an address for storing the second data in operation S120 in the memory device 130. Here, the command may include at least one active command and at least one write command. The command generator 115 may generate at least one address together with the at least one active command. The at least one address may indicate at least one of word lines connected to memory cells in the error zone of the bank 134.

Figure 6:
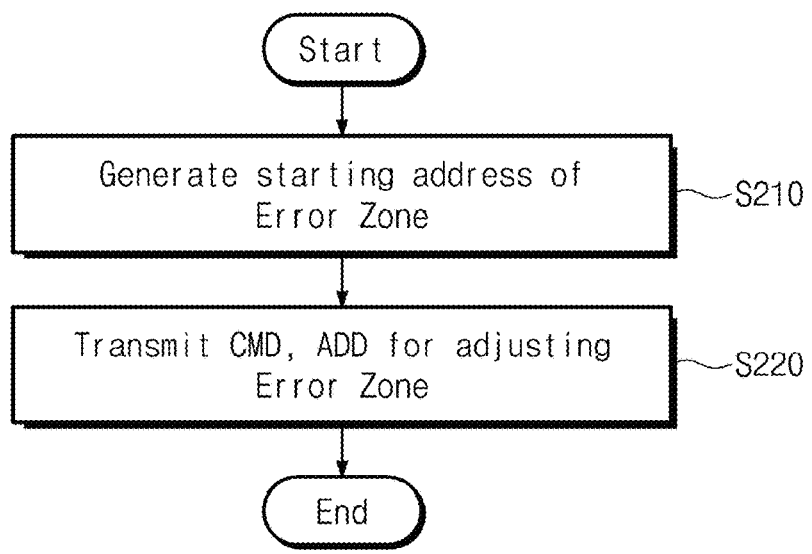
FIG. 6 illustrates an exemplary flowchart in which a memory controller of FIG. 3 adjusts an error zone and an error-free zone of a memory device.

FIG. 6 illustrates an exemplary flowchart in which a memory controller of FIG. 3 adjusts an error zone and an error-free zone of a memory device.

In operation S210, the command generator 115 of the memory controller 110 may generate a starting address of the error zone. For example, the starting address of the error zone may be a row address. The memory controller 110 may generate a command for setting the starting address of the error zone to the memory device 130. The error zone and the error-free zone may be divided on the basis of the starting address of the error zone, and the starting address may be also referred to as a "reference address".

In operation S220, the setting command for adjusting the error zone and the starting address of the error zone may be transmitted to the memory device 130. In an embodiment, the command generator 115 may generate or adjust the starting address of the error zone in response to a request of a user, a processor, or an application program. A value of the starting address may be any value between a minimum value and a maximum value of a row address for selecting word lines of the bank 134. The memory controller 110 may adjust the number of memory cells to be allocated to the error-free zone and the number of memory cells to be allocated to the error zone.

In an embodiment, the starting address of the error zone may be stored in the registers 140 of the memory device 130. The first counter 132_1 may generate a row address corresponding to word lines connected to memory cells in the error-free zone, based on the starting address of the error zone. The second counter 132_2 may generate a row address corresponding to word lines connected to memory cells in the error zone, based on the starting address of the error zone.

In an embodiment, the starting address of the error zone may also be stored in the registers 118 of the memory controller 110. As the memory controller 110 transmits a command for reading the registers 140 to the memory device 130, the memory controller 110 may read the starting address stored in the registers 140 and may store the read starting address in the registers 118 of the memory controller 110.

In an embodiment, because the number of banks is one or more, starting addresses of error zones of the banks may be equal to or different from each other. The memory controller 110 may set the starting addresses of the error zones of the banks to be equal or different. Even in any case, the starting addresses of the error zones of the banks may be stored in the registers 140. In the case where the starting addresses of the error zones of the banks are differently set, the memory device 130 may include the refresh controller 132 as much as the number of banks. In the case where the starting addresses of the error zones of the banks are equally set, the one refresh controller 132 may be used to refresh at least two or more banks. Memory cells of the two or more banks may be refreshed depending on a row address generated by the one refresh controller 132.

FIG. 7 illustrates an exemplary flowchart in which a memory controller of FIG. 3 adjusts a refresh ratio based on a temperature and a BER.

In operation S310, the memory controller 110 may check a current temperature of the memory device 130. A value of a current temperature that is sensed by the temperature sensor 141 may be stored in the registers 140, and may be provided to the memory controller 110 through the read circuit 138 and the DQ buffer 139 in response to a command of the memory controller 110.

In operation S320, the memory controller 110 may check a desired BER. For example, the desired BER may be determined by a request of a user, a processor, or an application program. The memory controller 110 may receive information of the desired BER.

In operation S330, the memory controller 110 may issue a command for adjusting a refresh ratio based on the current temperature of the memory device 130 and the desired BER and may transmit the command to the memory device 130. The memory controller 110 may adjust a refresh ratio based on the lookup table LUT stored in the registers 118. The lookup table LUT will be described in detail with reference to FIG. 8.

For example, a refresh ratio may be a ratio of a refresh rate of the error-free zone of the bank 134 and a refresh rate of the error zone of the bank 134. For another example, the refresh ratio may be a ratio of a time necessary to refresh all the memory cells in the error-free zone of the bank 134 and a time necessary to refresh all the memory cells in the error zone of the bank 134.

In an embodiment, the memory controller 110 may generate information about a refresh ratio together with the command for adjusting the refresh ratio. The memory controller 110 may transmit the information about the refresh ratio to the memory device 130, and the information about the refresh ratio may be stored in the registers 140 of the memory device 130. For example, the information about the refresh ratio may include information about a refresh rate or a refresh time of the error-free zone. For example, the information about the refresh ratio may include information about a refresh rate or a refresh time of the error zone. The refresh rate may indicate how frequently memory cells are accessed, and the refresh time may mean a refresh period. The refresh controller 132 may adjust the refresh rate of the error-free zone or the refresh rate of the error zone with reference to the information about the refresh ratio stored in the registers 140. The memory controller 110 may adjust a refresh ratio in response to a command of the memory controller 110.

FIG. 8 illustrates an example of a lookup table indicating a relationship between a BER and a refresh. The lookup table LUT of FIG. 8 indicates a relationship between a BER and a refresh time. In the lookup table LUT, refresh times may be respectively mapped onto BERs. The memory controller 110 may adjust a refresh time of the error-free zone with reference to the lookup table LUT stored in the registers 118.

For example, when a BER requested by a user, a processor, or an application program is $10^{-6}$, a refresh time of the error zone may be $2^3$ times a refresh time of the error-free zone. The memory controller 110 may verify a refresh time corresponding to a BER specified in the lookup table LUT and may adjust a refresh rate of the error zone. All values of refresh times specified in the lookup table LUT are only exemplary. As the requested BER increases, the refresh time of the error zone may increase. For another example, when a BER requested by the user, the processor, or the application program is a default, a refresh time of the error zone may be equal to a refresh time of the error-free zone. In this case, the memory device 130 may not operate as an approximate memory.

Referring to FIG. 8, the lookup table LUT may include information of refresh times according to BERs in a general temperature range. The lookup table LUT may include information of refresh times according to BERs in an extended temperature range that is different from or greater than the general temperature range. For example, a time when memory cells are able to retain data in the extended temperature range may be shorter than a time when memory cells are able to retain data in the general temperature range. Accordingly, refresh times in the extended temperature range may be shorter than refresh times in the general temperature range.

Figure 9:
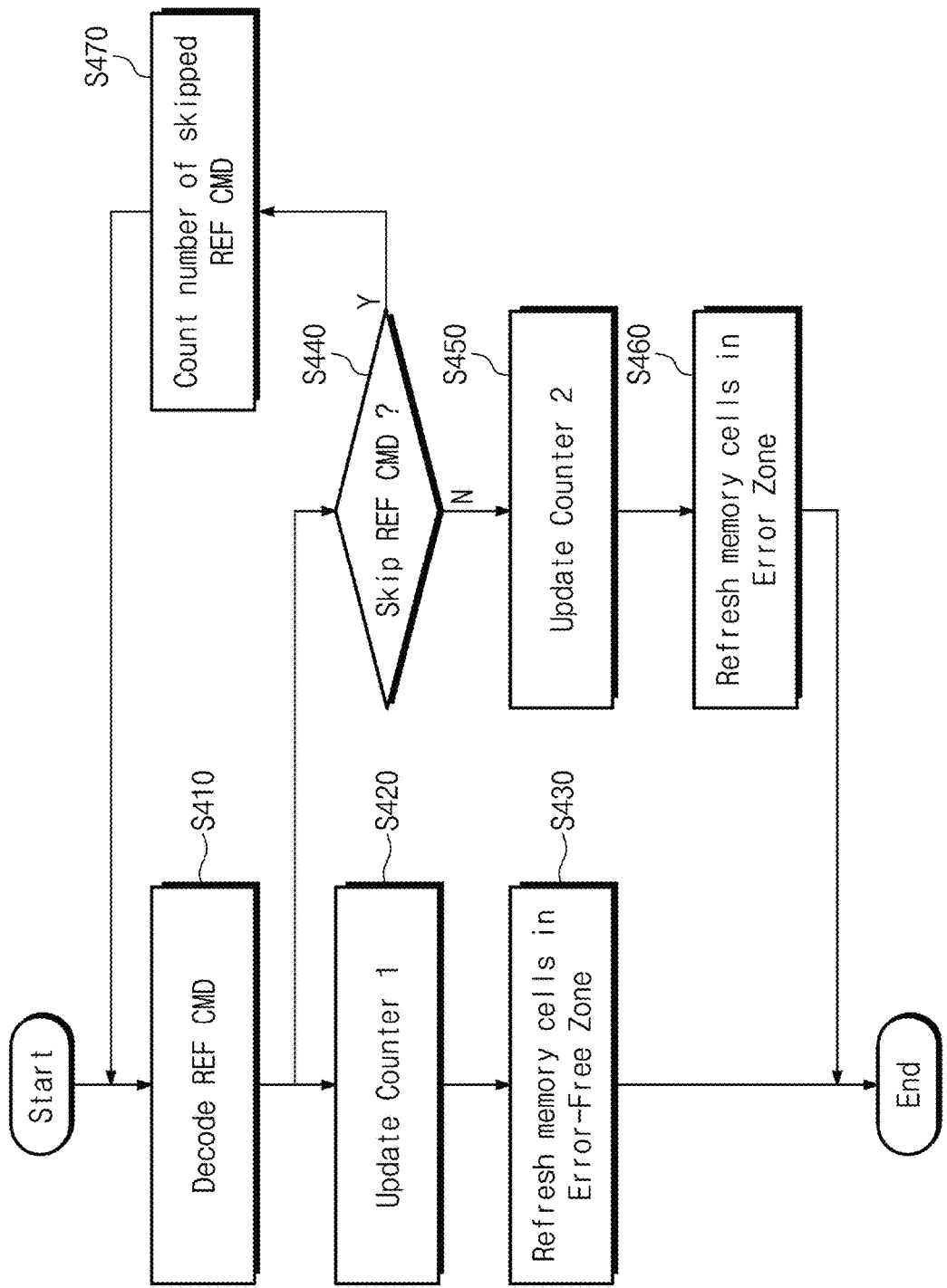
FIG. 9 illustrates an exemplary flowchart in which a memory device of FIG. 3 performs a refresh command.

FIG. 9 illustrates an exemplary flowchart in which a memory device of FIG. 3 performs a refresh command.

In operation S410, the command decoder 131 of the memory device 130 may decode a refresh command transmitted from the memory device 130. The memory controller 110 may repeatedly generate the refresh command. The command decoder 131 of the memory device 130 may decode the refresh command that is repeatedly transmitted. The command decoder 131 may control the refresh controller 132 and the row decoder 135.

In operation S420, the refresh controller 132 may trigger the first counter 132_1 under control of the command decoder 131. The first counter 132_1 may generate and update a row address corresponding to the error-free zone. A row address generated by the first counter 132_1 in operation S420 previously performed may be different from a row address generated by the first counter 132_1 in operation S420 currently performed.

In operation S430, the row decoder 135 may receive the row address generated by the first counter 132_1. The row decoder 135 may activate at least one word line corresponding to the row address and may then deactivate the word line. When the word line is activated and then deactivated by the row decoder 135, memory cells connected to the word line may be refreshed. The memory cells that are refreshed in operation S430 are memory cells in the error-free zone. Operation S410, operation S420, and operation S430 may be performed to refresh the memory cells in the error-free zone.

In operation S440, the refresh controller 132 may determine whether to skip the refresh command. When it is determined in operation S440 that the refresh command is not skipped (N), in operation S450, the refresh controller 132 may trigger the second counter 132_2. The second counter 132_2 may generate and update a row address corresponding to the error zone. A row address generated by the second counter 132_2 in operation S450 previously performed may be different from a row address generated by the second counter 132_2 in operation S450 currently performed. In operation S460, the row decoder 135 may receive the row address generated by the second counter 132_2. The row decoder 135 may activate at least one word line corresponding to the row address and may then deactivate the word line. When the word line is activated and then deactivated by the row decoder 135, memory cells connected to the word line may be refreshed. The memory cells that are refreshed in operation S460 are memory cells in the error zone.

When it is determined in operation S440 that the refresh command is skipped (Y), in operation S470, the refresh controller 132 may count the number of skipped refresh commands. As the number of skipped refresh commands increases, a refresh rate of the error zone may become slower, and the refresh time of the error zone may increase. Although not illustrated in FIG. 3, the refresh controller 132 may further include a counter that counts the number of skipped refresh commands. The refresh controller 132 may further include a comparator that compares the number of skipped refresh commands with a reference value. For example, the reference value may be stored in the registers 140 and may be changed by the memory controller 110 in operation S330 of FIG. 7. The reference value may be determined by information about a refresh ratio transmitted from the memory controller 110 or may be included in the information. For example, when the number of skipped refresh commands reaches the reference value, in operation S440, the refresh controller 132 may determine that a refresh command is not skipped. Operation S410, operation S440, operation S450, operation S460, and operation S470 may be performed to refresh the memory cells in the error zone.

Figure 10:
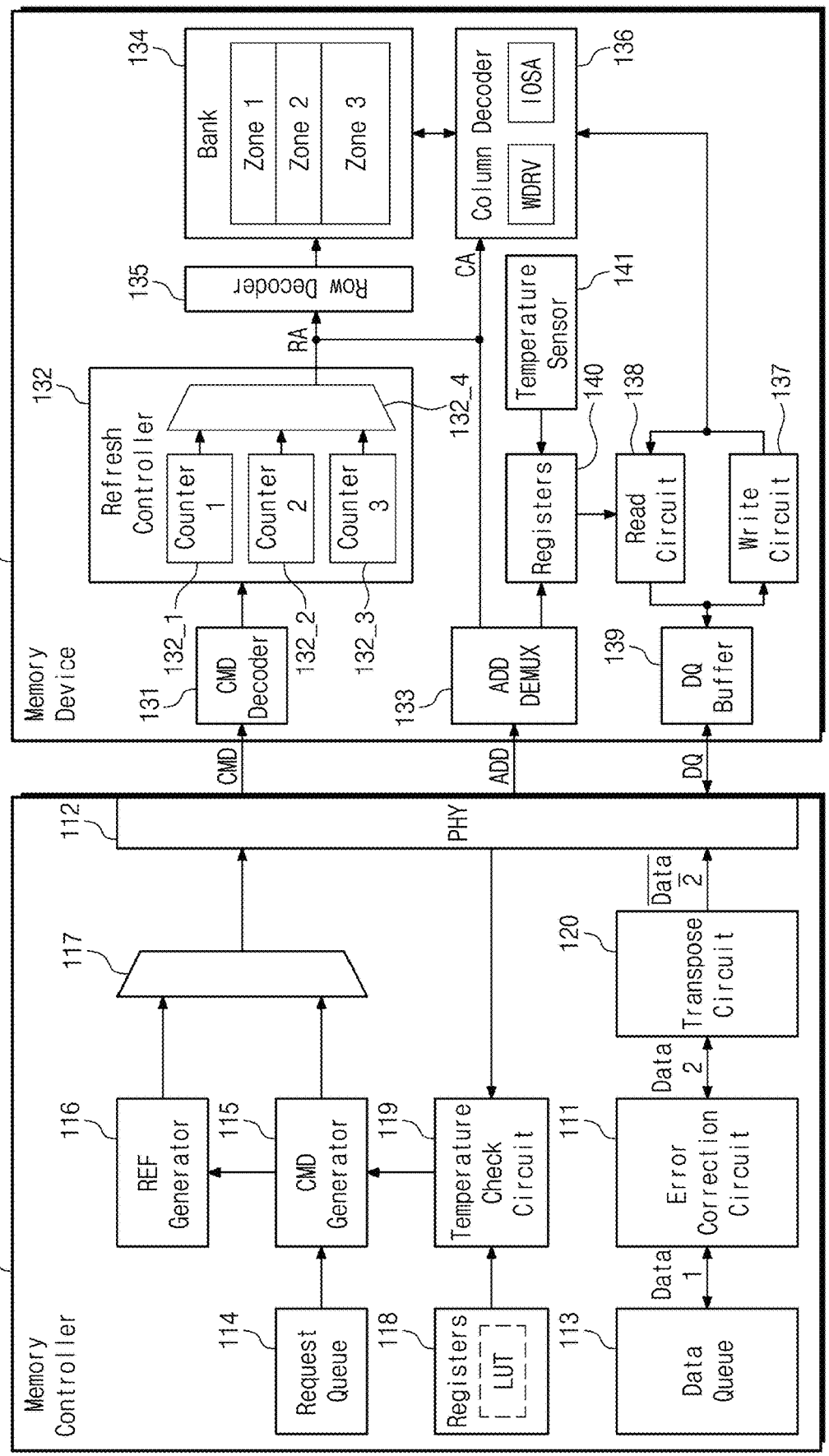
FIG. 10 illustrates an exemplary block diagram of an electronic device of FIG. 1 according to another embodiment of the inventive concept in detail.
Figure 11:
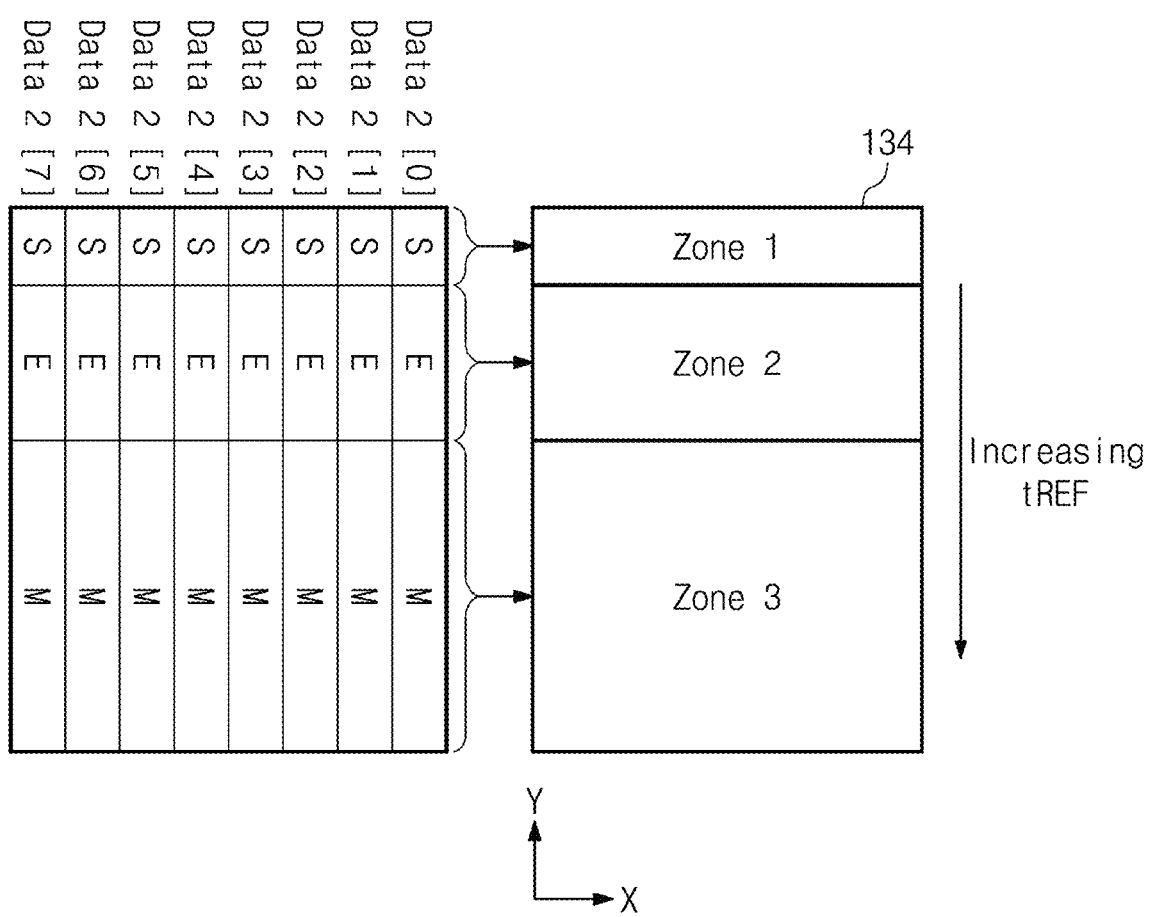
FIG. 11 illustrates an example where second data of FIG. 10 are stored in a bank of a memory device.

FIG. 10 illustrates an exemplary block diagram of an electronic device of FIG. 1 according to another embodiment of the inventive concept in detail. FIG. 11 illustrates an example where second data of FIG. 10 are stored in a bank of a memory device. FIGS. 10 and 11 will be described together. A difference between the electronic device 100 of FIG. 3 and the electronic device 100 of FIG. 10 will be mainly described.

The memory controller 110 may further include a transpose circuit 120 compared with the memory controller 110 of FIG. 3. The transpose circuit 120 may receive the second data (Data 2) encoded by the error correction circuit 111 and may convert the second data into second transpose data Data2. The PHY 112 may transmit the second transpose data, not the second data, to the memory device 130.

The second transpose data converted by the transpose circuit 120 may be stored in one or more pages of the bank 134. According to the description given with reference to FIG. 4, the second data (e.g., Data 2 [0]) may be stored at one page. In contrast, referring to FIG. 11, the second transpose data (e.g., Data2[0]) may be stored at one or more pages. The transpose circuit 120 may generate the second transpose data by changing a row and a column of the second data such that the second data are stored at one or more pages.

According to the description given with reference to FIG. 3, the bank 134 may be divided into only two zones, that is, the error-free zone and the error zone. Referring to FIGS. 10 and 11, the bank 134 may be divided into first, second, and third zones (respectively marked by Zone, Zone 2, and Zone 3 in FIG. 10). For example, the bank 134 may be divided into a plurality of zones, and "tREF" times of the plurality of zones may be different. Referring to FIG. 11, the "tREF" time of the second zone may be longer than the "tREF" time of the first zone. The "tREF" time of the third zone may be longer than the "tREF" time of the second zone. As described above, the time "tREF" means a time taken to refresh all the memory cells of a relevant zone. For example, the first zone may correspond to the error-free zone, and the second and third zones may correspond to zones defined by dividing the error zone. For another example, all the first to third zones may correspond to zones defined by dividing the error zone.

Referring to FIG. 11, a sign bit of the second transpose data may be stored in the first zone. Exponent bits of the second transpose data may be stored in the second zone. Mantissa bits of the second transpose data may be stored in the third zone. For example, an MSB of the second transpose data may be stored in one of memory cells connected to a word line in the first zone, and an LSB of the second transpose data may be stored in one of memory cells connected to a word line in the third zone. In the case where the bank 134 is divided into three or more zones, bits of the second transpose data may be distributed into and stored in three or more zones. The memory controller 110 may change positions of bits of the second data by using the transpose circuit 120 such that a significant bit is stored in a zone having a relatively short "tREF" time and an insignificant bit is stored in a zone having relatively long "tREF" time.

In an embodiment, the transpose circuit 120 may change logical values of bits of the second data. A time when a first logical value is retained at a memory cell may be longer than a time when a second logical value is retained at a memory cell. Accordingly, the transpose circuit 120 may compare the number of first logical values of the bits of the second data with the number of second logical values of the bits of the second data. The transpose circuit 120 may invert logical values of the bits of the second data in the unit of column based on a comparison result, such that more first logical values than the second logical values are stored in memory cells. The transpose circuit 120 may again invert bits of read data transmitted from the memory device 130.

The refresh controller 132 of the memory device 130 may further include a third counter 132_3. The first and second counters 132_1 and 132_2 of FIG. 10 may operate substantially the same as the first and second counters 132_1 and 132_2 of FIG. 3. The third counter 132_3 may operate substantially the same as the second counter 132_2. The first counter 132_1 may generate a row address for refreshing memory cells in the first zone. The second counter 132_2 may generate a row address for refreshing memory cells in the second zone. The third counter 132_3 may generate a row address for refreshing memory cells in the third zone. The multiplexer 132_4 may provide the row decoder 135 with a row address generated by the third counter 132_3. Periods or times when the first to third counters 132_1 to 132_3 generate row addresses may be different from each other. That is, the refresh controller 132 may control the first to third counters 132_1 to 132_3 such that "tREF" times of the first to third zones are different from each other. The refresh controller 132 may include counters as much as the number of divided zones of the bank 134.

Figure 12:
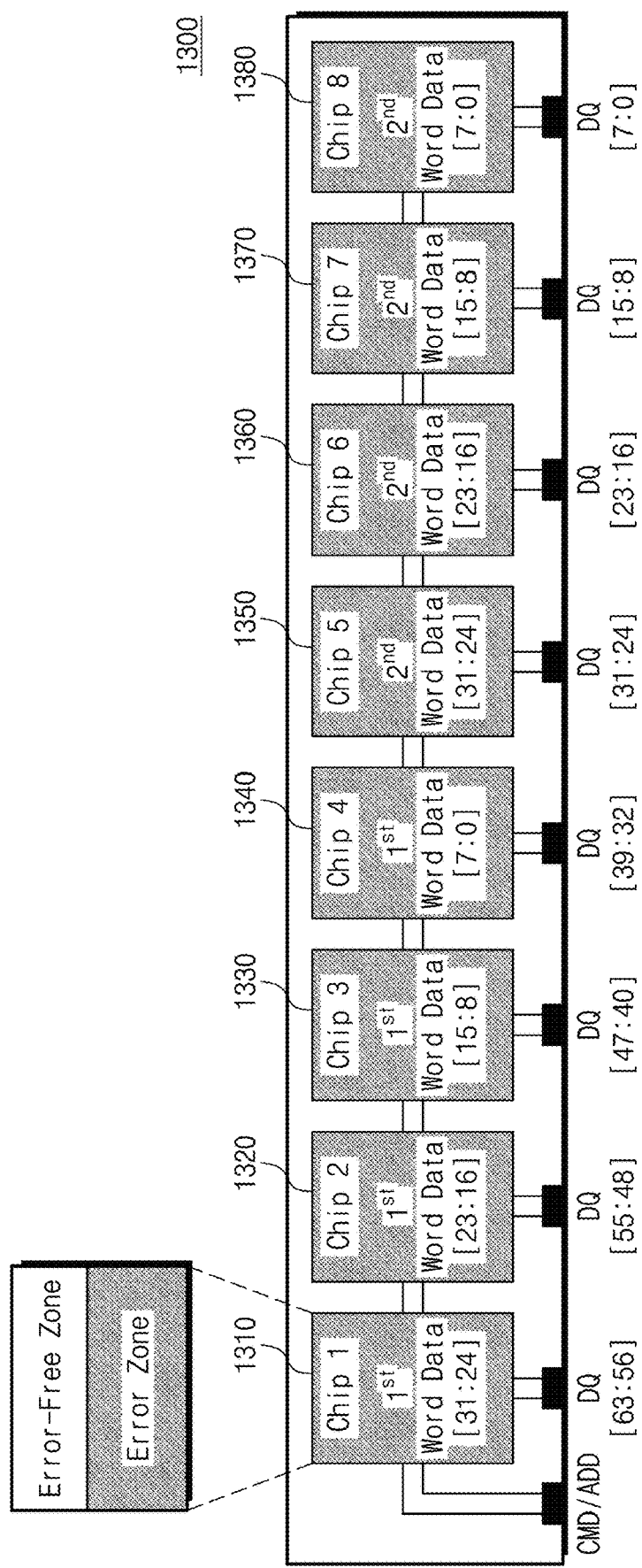
FIG. 12 illustrates a memory device of FIG. 1 according to an embodiment of the inventive concept.

FIG. 12 illustrates a memory device of FIG. 1 according to an embodiment of the inventive concept. A memory device 1300 may be a memory module. The memory module may be a dual in-line memory module (DIMM), a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)), which complies with the joint electron device engineering council (JEDEC) standard. The memory device 1300 may include first to eighth memory chips 1310 to 1380.

Each of the first to eighth memory chips 1310 to 1380 may include various DRAM devices such as a double data rate synchronous dynamic random access memory (DDR SDRAM), a DDR2 SDRAM, a DDR3 SDRAM, a DDR4 SDRAM, a DDR5 SDRAM, a low power double data rate (LPDDR) SDRAM, an LPDDR2 SDRAM, an LPDDR3 SDRAM, an LPDDR4 SDRAM, an LPDDR4X SDRAM, an LPDDR5 SDRAM, a graphics double data rate synchronous graphics random access memory (GDDR SGRAM), a GDDR2 SGRAM, a GDDR3 SGRAM, a GDDR4 SGRAM, a GDDR5 SGRAM, a GDDR6 SGRAM, etc.

Each of the first to eighth memory chips 1310 to 1380 may be the memory device 130 of FIG. 3 or 10 and may include the components of the memory device 130. Each of the first to eighth memory chips 1310 to 1380 may include memory cells corresponding to the error-free zone and memory cells corresponding to the error zone. The first to eighth memory chips 1310 to 1380 may receive a command/address CMD/ADD transmitted from a memory controller (refer to 110 of FIGS. 3 and 10) in common.

Each of the first to eighth memory chips 1310 to 1380 may transmit 8 DQ signals to a memory controller or may receive 8 DQ signals from the memory controller. The memory device 130 may transmit a total of 64 DQ signals DQ[63:0] to the memory controller or may receive a total of 64 DQ signals DQ[63:0] from the memory controller. For example, in the case where the number of bits of the second data is 32, the second data corresponding to a first word may be stored in the first to fourth memory chips 1310 to 1340. The second data corresponding to a second word may be stored in the fifth to eighth memory chips 1350 to 1380. Compared with the memory chips 1320 to 1340 and 1360 to 1380, the first and fifth memory chips 1310 and 1350 may store relatively significant bits, that is, a sign bit and exponent bits. As described above, the second data may be stored in memory cells corresponding to the error-free zones of the first to eighth memory chips 1310 to 1380.

Figure 13:
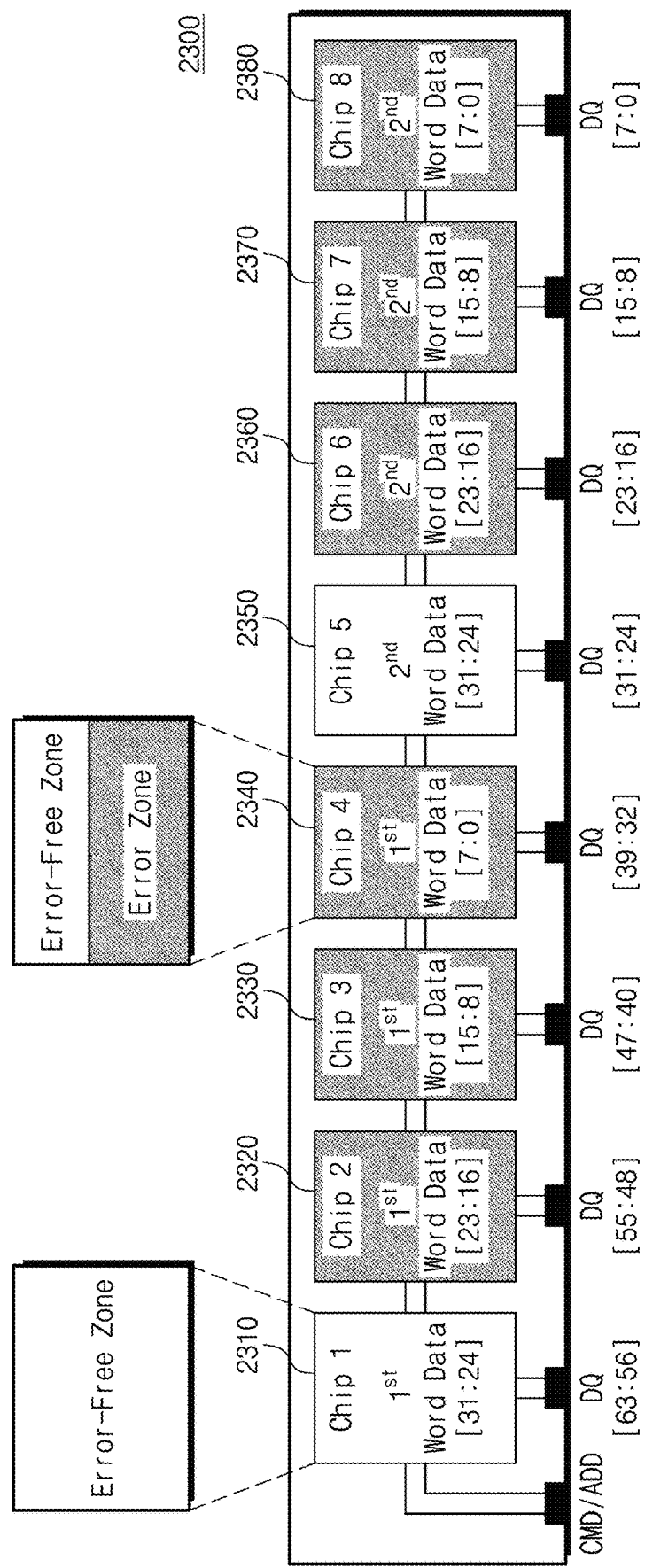
FIG. 13 illustrates a memory device of FIG. 1 according to another embodiment of the inventive concept.

FIG. 13 illustrates a memory device of FIG. 1 according to another embodiment of the inventive concept. A memory device 2300 may be a memory module that is similar to the memory device 1300 of FIG. 12. A difference between the memory device 2300 and the memory device 1300 will be mainly described.

Each of second to fourth memory chips 2320 to 2340 and sixth to eighth memory chips 2360 to 2380 may be the memory device 130 of FIG. 3 or 10 and may include the components of the memory device 130. Memory cells of the second to fourth memory chips 2320 to 2340 and the sixth to eighth memory chips 2360 to 2380 may be divided into the error-free zone and the error zone.

Unlike memory cells of the second to fourth memory chips 2320 to 2340 and the sixth to eighth memory chips 2360 to 2380, memory cells of the first and fifth memory chips 2310 and 2350 may not be divided into the error-free zone and the error zone. All the memory cells of the first and fifth memory chips 2310 and 2350 may correspond to the error-free zone. For example, each of the first and fifth memory chips 2310 and 2350 may include the components of the memory device 130 except for the second and third counters 132_2 and 132_3 and the multiplexer 132_4. For another example, each of the first and fifth memory chips 2310 and 2350 may include all components of the memory device 130. The memory controller 110 may set the first and fifth memory chips 2310 and 2350 such that memory cells of the bank 134 of the first and fifth memory chips 2310 and 2350 are refreshed at the same speed.

As in the case of FIG. 12, each of the first to eighth memory chips 2310 to 2380 may transmit 8 DQ signals to a memory controller or may receive 8 DQ signals from the memory controller. The memory device 2300 may transmit a total of 64 DQ signals DQ[63:0] to the memory controller or may receive a total of 64 DQ signals DQ[63:0] from the memory controller. For example, in the case where the number of bits of the second data is 32, the second data corresponding to a first word may be stored in the first to fourth memory chips 2310 to 2340. The second data corresponding to a second word may be stored in the fifth to eighth memory chips 2350 to 2380. Compared with the memory chips 2320 to 2340 and 2360 to 2380, the first and fifth memory chips 2310 and 2350 may store relatively significant bits, that is, a sign bit and exponent bits. A rate at which bits stored in the first and fifth memory chips 2310 and 2350 are refreshed may be higher than a rate at which bits stored in the second to fourth memory chips 2320 to 2340 and the sixth to eighth memory chips 2360 to 2380 are refreshed.

FIG. 14 illustrates is an exemplary block diagram of an electronic device according to another embodiment of the inventive concept. An electronic device 3000 may include a system on chip (SoC) 3100 and a memory device 3300. The SoC 3100 may include a memory controller 3111 including a PHY 3112, a processor 3120, and a memory 3130. The memory controller 3111 may be the memory controller 110 described with reference to FIGS. 1 to 11. The PHY 3112 may be the PHY 112 described with reference to FIGS. 1 to 11. The memory device 3300 may be the memory device 130 including memory cells divided into the error-free zone and the error zone.

The processor 3120 may execute various software (e.g., an application program, an operating system, a file system, and a device driver) loaded onto the memory 3130. The processor 3120 may include homogeneous multi-core processors or heterogeneous multi-core processors. For example, the processor 3120 may include at least one of a central processing unit (CPU), an image signal processing unit (ISP), a digital signal processing unit (DSP), a graphics processing unit (GPU), a vision processing unit (VPU), and a neural processing unit (NPU).

An application program, an operating system, a file system, a device driver, etc. for driving the electronic device 3000 may be loaded onto the memory 3130. For example, the memory 3130 may be an SRAM device that is implemented in the SoC 3100 and has a faster data input/output speed than the memory device 3300 and may be implemented by using registers, latches, or flip-flops. The memory 3130 may be referred to as an "on-chip memory" or a "buffer memory".

The memory 3130 may be a non-transitory computer-readable medium that stores a program code. The memory 3130 may be a random access memory (RAM), a flash memory, a read only memory (ROM), an electrically programmable ROM (EPROM), an electrically erasable programmable ROM (EEPROM), a register, a hard disk drive, a removable disk, a CD-ROM, or any type of storage medium. As illustrated in FIG. 14, the memory 3130 may be implemented in the SoC 3100; alternatively, unlike the example illustrated in FIG. 14, the memory 3130 may be a storage medium that is implemented independently of the SoC 3100 in the electronic device 3000 or is positioned outside the electronic device 3000.

In an embodiment, a program code that is stored or loaded onto the memory 3130 may be executed by the processor 3120. Under control of the processor 3120 executing the program code, the memory controller 3111 may perform operation S110 to operation S130, operation S210 and operation S220, and operation S310 to operation S330 of the flowcharts of FIGS. 5 to 7.

In an embodiment, the program code stored in the memory 3130 may be executed by another processor (not illustrated) in the memory controller 3111, which is different from the processor 3120. The processor in the memory controller 3111 may execute the program code and may perform operation S110 to operation S130, operation S210 and operation S220, and operation S310 to operation S330 of the flowcharts of FIGS. 5 to 7.

In an embodiment, the memory controller 3111, the processor 3120, and the memory 3130 of the SoC 3100 may be interconnected through a bus. The bus may be of an AMBA (Advanced Microcontroller Bus Architecture) standard bus protocol type. The bus type of the AMBA may be an AHB (Advanced High-Performance Bus), an APB (Advanced Peripheral Bus), or an AXI (Advanced eXtensible Interface).

Figure 15:
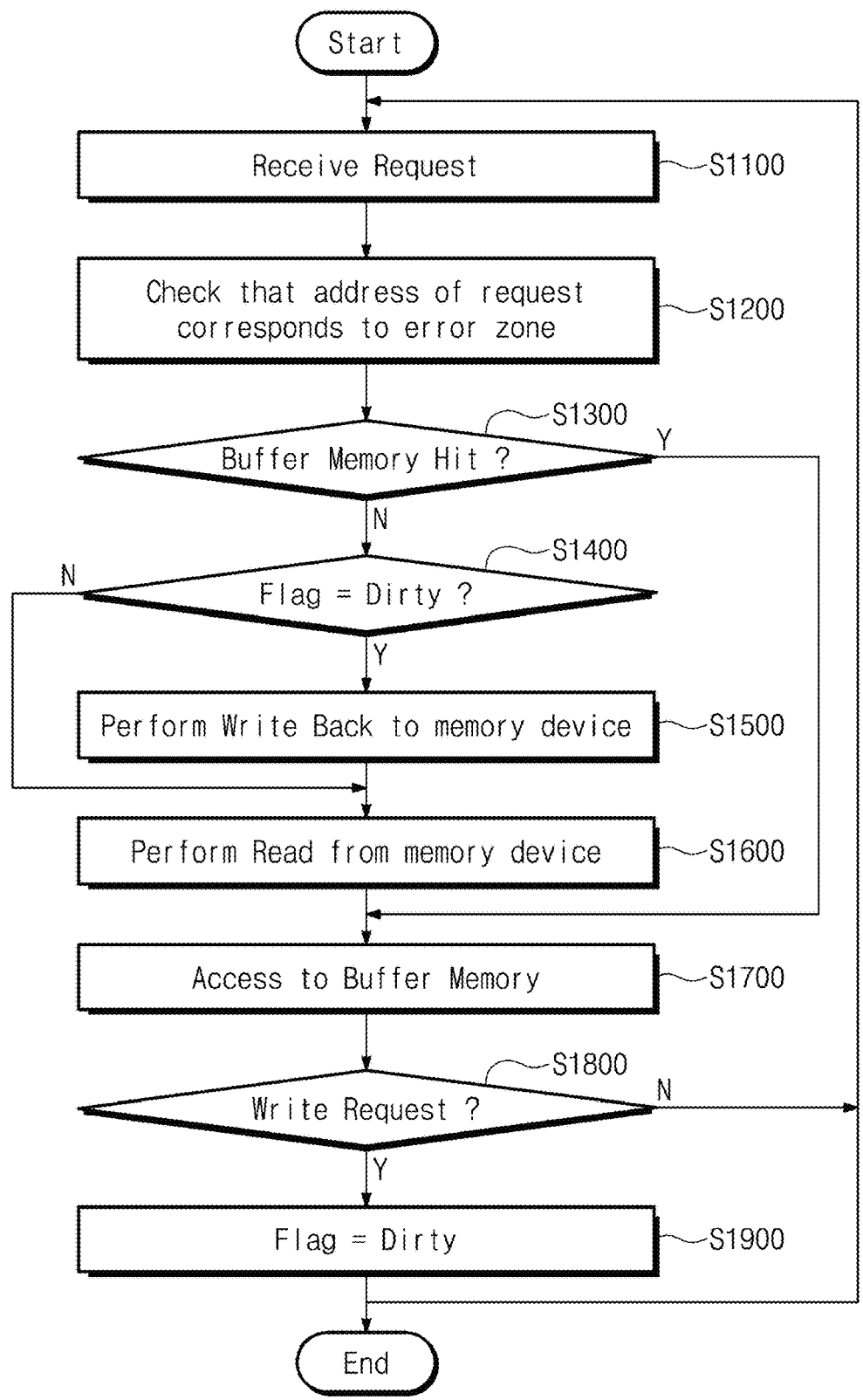
FIG. 15 illustrates an exemplary flowchart illustrating an operation method of a memory controller of FIG. 14.

FIG. 15 illustrates an exemplary flowchart illustrating an operation method of a memory controller of FIG. 14.

In operation S1100, the memory controller 3111 may receive a request of the processor 3120. The processor 3120 may execute a neural network, such as a DNN, a CNN, an RNN, or an SNN, and an application program. The processor 3120 may provide a request for data to the memory controller 3111. The processor 3120 may provide data to the memory controller 3111.

In operation S1200, the memory controller 3111 may translate a logical address provided from the processor 3120 into a physical address (e.g., a bank address, a row address, and a column address) of the memory device 3300. The memory controller 3111 may identify whether the physical address that is obtained by translating the logical address associated with the request corresponds to the error zone.

In operation S1300, the memory controller 3111 may identify whether data corresponding to the request in operation S1100 is cached (or stored) in the memory 3130. The memory 3130 described in operation S1300 may be a cache memory, a buffer memory, or an on-chip memory of the SoC 3100. When the data corresponding to the request in operation S1100 is cached (hit) (Y), operation S1700 may be performed. When the data corresponding to the request in operation S1100 is not cached (miss) (N), operation S1400 may be performed.

In operation S1400, the memory controller 3111 may identify whether a flag bit of a cache line (or an entry) of the memory 3130 is dirty. That the flag bit is set to "dirty" (Y) may mean that data of a cache line are different from data of the memory device 3300. In operation S1500, the memory controller 3111 may write the data of the cache line in the memory device 3300. When the flag bit is set to "clean", not "dirty" (N), the memory controller 3111 may read data from the memory device 3300 and may write the read data in the cache line.

In operation S1700, the memory controller 3111 may access the memory 3130. In operation S1800, the memory controller 3111 may identify whether the request in operation 1100 is a write request. When the request is the write request (Y), in operation S1900, the memory controller 3111 may set a flag bit of a cache line to "dirty". When the request is a read request (N), the memory controller 3111 may return the data cached in the memory 3130 to the processor 3120. Afterwards, the memory controller 3111 may receive a new request (S1100).

Figure 16:
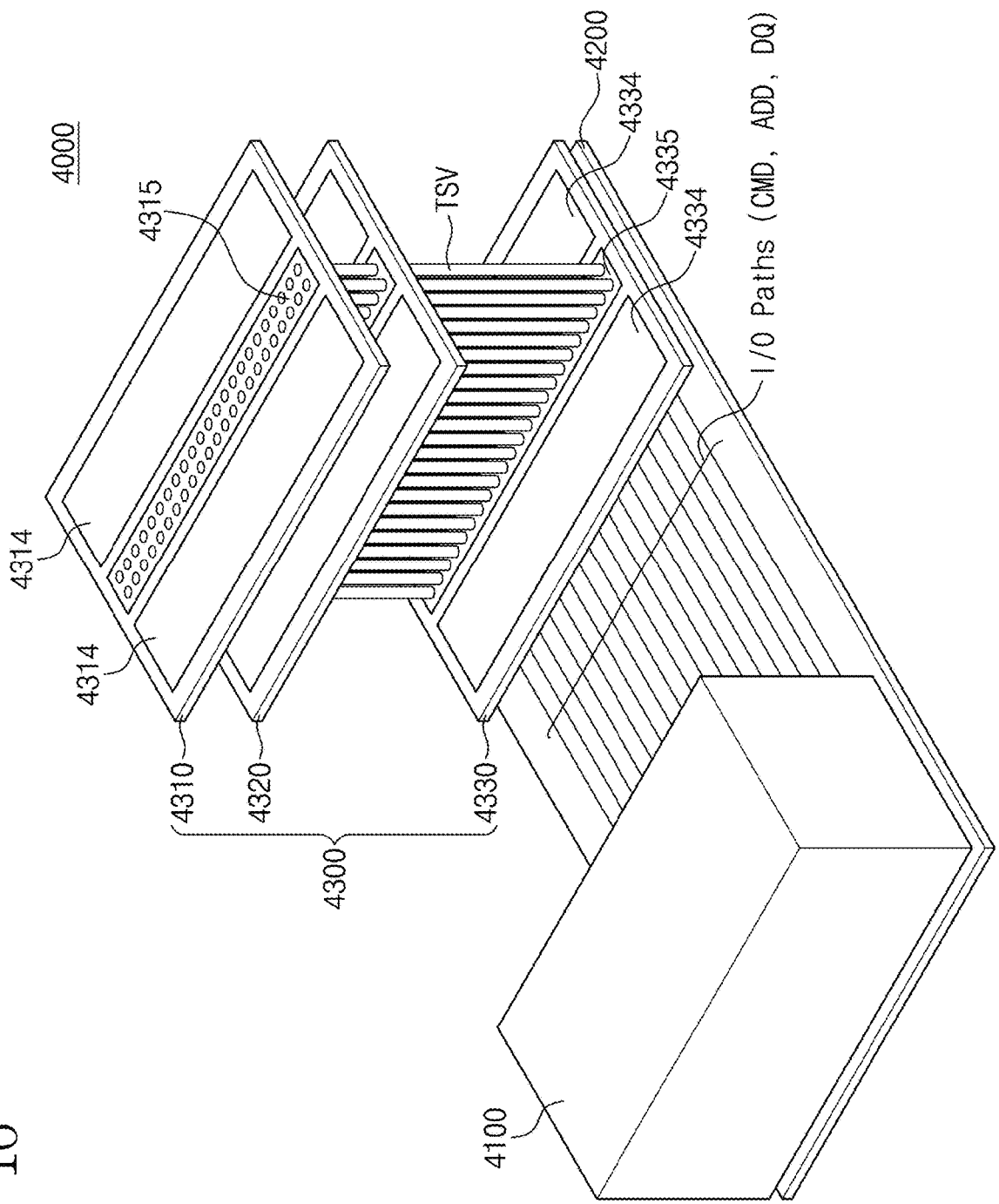
FIG. 16 illustrates is a block diagram of an electronic device according to another embodiment of the inventive concept.

FIG. 16 illustrates is a block diagram of an electronic device according to another embodiment of the inventive concept. An electronic device 4000 may include a SoC 4100, a board 4200, and a memory device 4300.

The SoC 4100 may be disposed on one surface of the board 4200, and solder balls or bumps may be disposed on one surface of the SoC 4100. The SoC 4100 and the substrate 4200 may be electrically interconnected through the solder balls or the bumps. The SoC 4100 may include the memory controller 3111, the PHY 3112, the processor 3120, the memory 3130, etc. of FIG. 13. The SoC 4100 may include the components of the memory controller 110. The memory controller of the SoC 4100 may perform operations of the flowcharts FIGS. 5 to 7 and 15.

The board 4200 may provide an input/output path between the SoC 4100 and the memory device 4300. For example, the board 4200 may be a printed circuit board, a flexible circuit board, a ceramic substrate, or an interposer. In the case where the board 4200 is the interposer, the board 4200 may be implemented by using a silicon wafer. The input/output paths may be implemented within the board 4200. A command, an address, and data may be transmitted through the input/output paths.

The memory device 4300 may include memory dies 4310 and 4320 and a buffer die 4330, which are stacked in a vertical direction. The memory device 4300 may be a memory device, in which DRAM dies are stacked, such as a high bandwidth memory (HBM), HBM2, HBM3, etc. The memory device 4300 may be disposed on one surface of the board 4200, and solder balls or bumps may be disposed on one surface of the memory device 4300. The memory device 4300 and the board 4200 may be electrically interconnected through the solder balls or the bumps.

Through-silicon vias TSV may provide physical or electrical paths between the memory dies 4310 and 4320 and the buffer die 4330. For example, the through-silicon vias TSV may be arranged in the form of a matrix, and locations of the through-silicon vias TSV are not limited to the example of FIG. 16.

The memory die 4310 may include a first region 4314 and a second region 4315. The components of the memory device 130 described with reference to FIG. 3 or 10 may be placed in the first region 4314. The through-silicon vias TSV may be placed in the second region 4315, or circuits for transmitting or receiving signals through the through-silicon vias TSV may be placed in the second region 4315. The memory die 4320 may be implemented to be substantially the same as the memory die 4310.

The buffer die 4330 (or referred to as a "core die" or a "logic die") may include a first region 4334 and a second region 4335. At least one receiver that receives the command CMD, the address ADD, or the data input/output signal DQ transmitted through input/output (I/O) paths from the SoC 4100 may be placed in the first region 4334. At least one transmitter that transmits a data input/output signal DQ to the SoC 4100 through the input/output paths may be placed in the first region 4334. Also, the components of the memory device 130 described with reference to FIG. 3 or 10 may be placed in the first region 4334. The through-silicon vias TSV may be placed in the second region 4335, or circuits for transmitting or receiving signals through the through-silicon vias TSV may be placed in the second region 4335.

A memory controller according to an embodiment of the inventive concept may store data in an approximate memory device based on a priority-based ECC. The memory controller may reduce refresh power consumption of the approximate memory device. The memory controller may adjust a refresh rate of the approximate memory device depending on a BER and may correct an error, which is capable of occurring in a memory device operating at a low refresh rate, by using the priority-based ECC.

In an embodiment, the buffer die 4330 may include the memory controller 3111, the PHY 3112, the processor 3120, the memory 3130, etc. of FIG. 13. The buffer die 4330 may include the components of the memory controller 110. The components of the memory controller 110 of the buffer die 4330 may perform operations of the flowcharts FIGS. 5 to 7 and 15.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory controller comprising:
   an error correction circuit configured to replace some bits of first data with parity bits and to generate second data including remaining bits of the first data and the parity bits replaced from the some bits, the parity bits associated with an error correction operation; and
   a physical layer configured to transmit the second data instead of the first data to a memory device, wherein
   a memory cell array of the memory device is divided into a first zone and a second zone,
   the second data are stored in the second zone, and
   the memory controller is configured to receive a bit error rate (BER) and adjust a refresh rate of the first zone and a refresh rate of the second zone based on the received BER.

2. The memory controller of claim 1, wherein the some bits correspond to some bits of exponent bits of the first data expressed by a floating-point format.

3. The memory controller of claim 1, wherein the some bits correspond to lower bits of the first data.

4. The memory controller of claim 1, wherein the error correction circuit is further configured to perform an error correction operation on third data transmitted from the memory device by using parity bits of the third data.

5. The memory controller of claim 1, wherein the first data are used in an operation of a neural network.

6. The memory controller of claim 1, wherein the first data are weight parameters to be used in an operation of a neural network, and
   values of the some bits are fixed.

7. The memory controller of claim 1, wherein the memory controller is further configured to adjust a reference address to be provided to the memory device, and
   the memory cell array of the memory device is divided into the first zone and the second zone depending on the reference address.

8. The memory controller of claim 7, wherein the refresh rate of the first zone is higher than the refresh rate of the second zone, and
   the physical layer is further configured to transmit an address indicating the second zone to the memory device such that the second data are stored in the second zone.

9. The memory controller of claim 7, wherein the memory controller is further configured to adjust a ratio of the refresh rate of the first zone and the refresh rate of the second zone, the adjusting the ratio being based on the bit error rate (BER).

10. A non-transitory computer-readable medium storing a program code that, when executed by a processor, causes the processor to:
    replace some bits of first data with parity bits, the parity bits associated with an error correction operation;
    generate second data including remaining bits of the first data and the parity bits replaced from the some bits; and
    generate a write command for storing the second data in a memory device, wherein
    a memory cell array of the memory device is divided into a first zone and a second zone,
    the second data are stored in the second zone, and
    the program code, when executed by the processor, further causes the processor to receive a bit error rate (BER) and adjust a refresh rate of the first zone and a refresh rate of the second zone based on the received BER.

11. The non-transitory computer-readable medium of claim 10, wherein the program code, when executed by the processor, further causes the processor to generate a setting command and a reference address for dividing the memory cell array of the memory device into the first zone and the second zone.

12. The non-transitory computer-readable medium of claim 11, wherein the program code, when executed by the processor, further causes the processor to repeatedly generate a refresh command for the memory device, and
    the refresh rate of the first zone by the refresh command is higher than the refresh rate of the second zone by the refresh command.

13. The non-transitory computer-readable medium of claim 11, wherein the program code, when executed by the processor, further causes the processor to generate the setting command for adjusting a ratio of the refresh rate of the first zone and the refresh rate of the second zone, based on the bit error rate (BER).

14. The non-transitory computer-readable medium of claim 10, wherein the first data are used in an operation of a neural network, and
    wherein the some bits correspond to some bits of exponent bits of the first data expressed by a floating-point format or correspond to lower bits of the first data.

15. An electronic device comprising:
    a processor configured to generate first data;

a memory controller configured to replace some bits of the first data with parity bits and to generate second data including remaining bits of the first data and the parity bits replaced from the some bits, the parity bits associated with an error correction operation; and a memory device configured to store the second data transmitted from the memory controller, wherein a memory cell array of the memory device is divided into a first zone and a second zone, the second data are stored in the second zone, and the memory controller is further configured to receive a bit error rate (BER) and adjust a refresh rate of the first zone and a refresh rate of the second zone based on the received BER.

16. The electronic device of claim 15, wherein the processor is further configured to generate the first data by executing a neural network application program.

17. The electronic device of claim 15, wherein the second zone has the refresh rate lower than the refresh rate of the first zone, the memory controller is further configured to generate a command for storing the second data in the memory device and an address indicating at least a portion of the second zone, and the second data are stored in the second zone by the command and the address.

18. The electronic device of claim 15, wherein the memory device includes the memory cell array including first memory cells connected to a first word line and second memory cells connected to a second word line, a most significant bit (MSB) of the second data is stored in one of the first memory cells and a least significant bit (LSB) of the second data is stored in one of the second memory cells, and the refresh rate of the first memory cells is higher than the refresh rate of the second memory cells.

19. The electronic device of claim 15, wherein the second zone has the refresh rate lower than the refresh rate of the first zone, and the memory controller includes registers configured to store a lookup table in which bit error rates and ratios of the refresh rate of the first zone and the refresh rate of the second zone are mapped.

20. The electronic device of claim 15, wherein the memory device includes a dynamic random access memory (DRAM) device.

* * * * *